(12) United States Patent
Kang et al.

(10) Patent No.: US 10,825,775 B2
(45) Date of Patent: Nov. 3, 2020

(54) SEMICONDUCTOR PACKAGE INTEGRATING ACTIVE AND PASSIVE COMPONENTS WITH ELECTROMAGNETIC SHIELDING

(71) Applicant: SAMSUNG ELECTRONICS CO., LTD., Suwon-si (KR)

(72) Inventors: Myung Sam Kang, Suwon-Si (KR); Jin Su Kim, Suwon-Si (KR); Yong Jin Park, Suwon-Si (KR); Young Gwan Ko, Suwon-Si (KR); Yong Jin Seol, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 96 days.

(21) Appl. No.: 16/149,102

(22) Filed: Oct. 1, 2018

(65) Prior Publication Data
US 2019/0371731 A1 Dec. 5, 2019

(30) Foreign Application Priority Data

Jun. 4, 2018 (KR) .......................... 10-2018-0064362

(51) Int. Cl.
*H01L 29/00* (2006.01)
*H01L 23/538* (2006.01)
(Continued)

(52) U.S. Cl.
CPC ........ *H01L 23/5389* (2013.01); *H01L 21/568* (2013.01); *H01L 23/3128* (2013.01);
(Continued)

(58) Field of Classification Search
CPC .................................................. H01L 23/5389
(Continued)

(56) References Cited

U.S. PATENT DOCUMENTS 8,736,033 B1 5/2014 Chuo et al.
9,721,903 B2 8/2017 Lee et al.
(Continued)

FOREIGN PATENT DOCUMENTS

JP 2012-39090 A 2/2012
JP 2013-105992 A 5/2013
(Continued)

OTHER PUBLICATIONS

Communication dated Oct. 24, 2019 by the Taiwan Intellectual Property Office in counterpart Taiwan Patent Application No. 107134187.
(Continued)

*Primary Examiner* — Ajay Arora
(74) *Attorney, Agent, or Firm* — Sughrue Mion, PLLC

(57) ABSTRACT

A semiconductor package includes a support member including a resin body having a first surface and a second surface opposing each other and having a cavity, and at least one passive component embedded in the resin body and having a connection terminal exposed from the first surface; a first connection member disposed on the first surface of the resin body, and having a first redistribution layer on the first insulating layer and connected to the connection terminal; a second connection member disposed on the first connection member and covering the cavity, and having a second redistribution layer on the second insulating layer and connected to the first redistribution layer; and a semiconductor chip disposed on the second connection member in the cavity.

27 Claims, 22 Drawing Sheets

(51) Int. Cl.
*H01L 23/552* (2006.01)
*H01L 23/00* (2006.01)
*H01L 23/367* (2006.01)
*H01L 23/31* (2006.01)
*H01L 21/56* (2006.01)

(52) U.S. Cl.
CPC ........ *H01L 23/3675* (2013.01); *H01L 23/552* (2013.01); *H01L 24/13* (2013.01); *H01L 24/24* (2013.01); *H01L 24/25* (2013.01); *H01L 24/82* (2013.01); *H01L 2224/13024* (2013.01); *H01L 2224/24011* (2013.01); *H01L 2224/24137* (2013.01); *H01L 2224/24195* (2013.01); *H01L 2224/25174* (2013.01); *H01L 2224/82005* (2013.01)

(58) Field of Classification Search
USPC .......................................................... 257/659
See application file for complete search history.

(56) References Cited

U.S. PATENT DOCUMENTS

| | | | |
|---|---|---|---|
| 9,853,003 | B1 | 12/2017 | Han et al. |
| 2011/0198762 | A1* | 8/2011 | Scanlan ............. H01L 23/3128 257/793 |
| 2012/0013021 | A1 | 1/2012 | Kobayashi et al. |
| 2015/0084206 | A1* | 3/2015 | Lin .................... H01L 23/3135 257/774 |
| 2015/0170980 | A1 | 6/2015 | Kosaka et al. |
| 2015/0348936 | A1 | 12/2015 | Lin et al. |
| 2016/0336296 | A1 | 11/2016 | Jeong et al. |
| 2017/0033063 | A1 | 2/2017 | Lin et al. |
| 2017/0040265 | A1* | 2/2017 | Park ........................ H01L 24/19 |
| 2017/0103951 | A1* | 4/2017 | Lee ...................... H01L 23/5389 |
| 2017/0309571 | A1 | 10/2017 | Yi et al. |
| 2018/0053732 | A1 | 2/2018 | Baek et al. |
| 2018/0076147 | A1 | 3/2018 | Lim et al. |
| 2018/0114758 | A1 | 4/2018 | Yao et al. |
| 2018/0138029 | A1 | 5/2018 | Kim et al. |
| 2018/0145033 | A1 | 5/2018 | Yi et al. |
| 2019/0189583 | A1 | 6/2019 | Baek et al. |
| 2019/0221447 | A1* | 7/2019 | Chavali ............... H01L 21/4857 |

FOREIGN PATENT DOCUMENTS

| | | |
|---|---|---|
| JP | 2014-72279 A | 4/2014 |
| JP | 2015-115558 A | 6/2015 |
| JP | 2016-219535 A | 12/2016 |
| JP | 2016-219798 A | 12/2016 |
| KR | 10-2017-0015065 A | 2/2017 |
| KR | 10-2017-0043440 A | 4/2017 |
| KR | 10-2017-0121671 A | 11/2017 |
| KR | 10-2018-0012187 A | 2/2018 |
| KR | 10-2018-0020849 A | 2/2018 |
| KR | 10-2018-0029822 A | 3/2018 |
| KR | 10-2018-0058095 A | 5/2018 |
| KR | 10-1982061 B1 | 5/2019 |

OTHER PUBLICATIONS

Communication dated Dec. 3, 2019 by the Japanese Patent Office in counterpart Japanese Patent Application No. 2018-185459.
Communication dated Jul. 1, 2019, issued by the Korean Intellectual Property Office in counterpart Korean Patent Application No. 10-2018-0064362.

* cited by examiner

I2-I2'

I3-I3'

I4-I4'

I5-I5'

SEMICONDUCTOR PACKAGE INTEGRATING ACTIVE AND PASSIVE COMPONENTS WITH ELECTROMAGNETIC SHIELDING

CROSS-REFERENCE TO RELATED APPLICATION

This application claims the benefit of priority to Korean Patent Application No. 10-2018-0064362, filed on Jun. 4, 2018 with the Korean Intellectual Property Office, the entirety of which is incorporated herein by reference.

BACKGROUND

The present disclosure relates to a semiconductor package.

As the sizes of mobile displays increase, increased battery capacity is required. Since the area occupied by the battery may be increased due to the increase in battery capacity, a size of a printed circuit board (PCB) is required to be reduced. As a result, there is continuing interest in modularization due to a reduction in a mounting area of components.

On the other hand, as a technology for mounting a plurality of components according to the related art, chip on board (COB) technology is exemplified. COB is a method of mounting individual passive components and semiconductor packages on a printed circuit board using Surface Mount Technology (SMT). Such a method is cost effective. However, there may be problems in which a large mounting area is required, depending on the minimum spacing between components, electromagnetic interference (EMI) between components is high, and electric noise is increased due to a long distance between a semiconductor chip and a passive component.

SUMMARY

An aspect of the present disclosure provides a semiconductor package having a structure capable of optimizing a space in which a semiconductor chip and a passive component are mounted while allowing for easy implementation of an EMI shielding structure.

According to an aspect of the present disclosure, a semiconductor package includes: a support member including a resin body having a first surface and a second surface opposing each other and having a cavity passing through the first surface and the second surface, and at least one passive component embedded in the resin body and having a connection terminal exposed from the first surface; a first connection member having a first insulating layer disposed on the first surface of the resin body, and a first redistribution layer disposed on the first insulating layer and connected to the connection terminal; a second connection member having a second insulating layer disposed on the first connection member and covering one surface of the cavity, and a second redistribution layer disposed on the second insulating layer and connected to the first redistribution layer; a semiconductor chip disposed on the second connection member in the cavity and having a connection pad connected to the second redistribution layer; and an encapsulant covering the second surface of the resin body while encapsulating the semiconductor chip located in the cavity.

According to an aspect of the present disclosure, a semiconductor package includes: a support member including a resin body having a first surface and a second surface opposing each other and having at least one cavity passing through the first surface and the second surface, and a plurality of passive components embedded in the resin body and having a connection terminal exposed from the first surface; a first connection member having a first insulating layer disposed on the first surface of the resin body, and a first redistribution layer disposed on the first insulating layer and connected to the connection terminal; a second connection member having a second insulating layer disposed on a lower surface of the first connection member and covering one surface of the at least one cavity, and a plurality of second redistribution layers disposed on different levels in the second insulating layer, the plurality of second redistribution layer being connected to the first redistribution layer or another adjacent second redistribution layer; a semiconductor chip disposed on the second connection member in the at least one cavity and having a connection pad connected to the second redistribution layer; a first shielding layer disposed on the second surface of the resin body and an inner side wall of the at least one cavity, and connected to the first redistribution layer; an encapsulant covering the second surface of the resin body while encapsulating the semiconductor chip located in the at least one cavity; and a second shielding layer disposed on an upper surface of the encapsulant, and connected to the first shielding layer.

According to an aspect of the present disclosure, a semiconductor package includes a resin body, and a passive component partially embedded in the resin body and having a connection terminal exposed from the resin body; a first connection member including a first insulating layer disposed on the resin body, and a first redistribution layer disposed on the first insulating layer and including a first redistribution via penetrating the first insulating layer and connected to the connection terminal of the passive component; a semiconductor chip disposed in a cavity of the resin body and having a connection pad; a second connection member having a second insulating layer disposed on the first connection member and the semiconductor chip, and a second redistribution layer disposed on the second insulating layer and connected to the first redistribution layer and the connection pad of the semiconductor chip; and an encapsulant covering the resin body and the semiconductor chip, and including a portion disposed between the semiconductor chip and the first insulating layer of first connection member.

According to an aspect of the present disclosure, a semiconductor package includes a resin body, and a passive component partially embedded in the resin body and having a connection terminal exposed from the resin body; a semiconductor chip disposed in a cavity of the resin body and having a connection pad; a connection member having an insulating layer disposed on the resin body and the semiconductor chip, and a redistribution layer disposed on the insulating layer and connected to the connection terminal of the passive component and the connection pad of the semiconductor chip; an encapsulant covering the resin body and the semiconductor chip, and including a portion disposed between the semiconductor chip and the resin body; and a first shielding layer including a first portion disposed on an upper surface of the resin body and a second portion extending from the first portion and covering an inner side wall of the cavity. The second portion covering the inner side wall of the cavity is in physical contact with a portion of the resin body between the passive component and the semiconductor chip.

BRIEF DESCRIPTION OF DRAWINGS

The above and other aspects, features, and advantages of the present disclosure will be more clearly understood from the following detailed description taken in conjunction with the accompanying drawings, in which.

Figure 20:
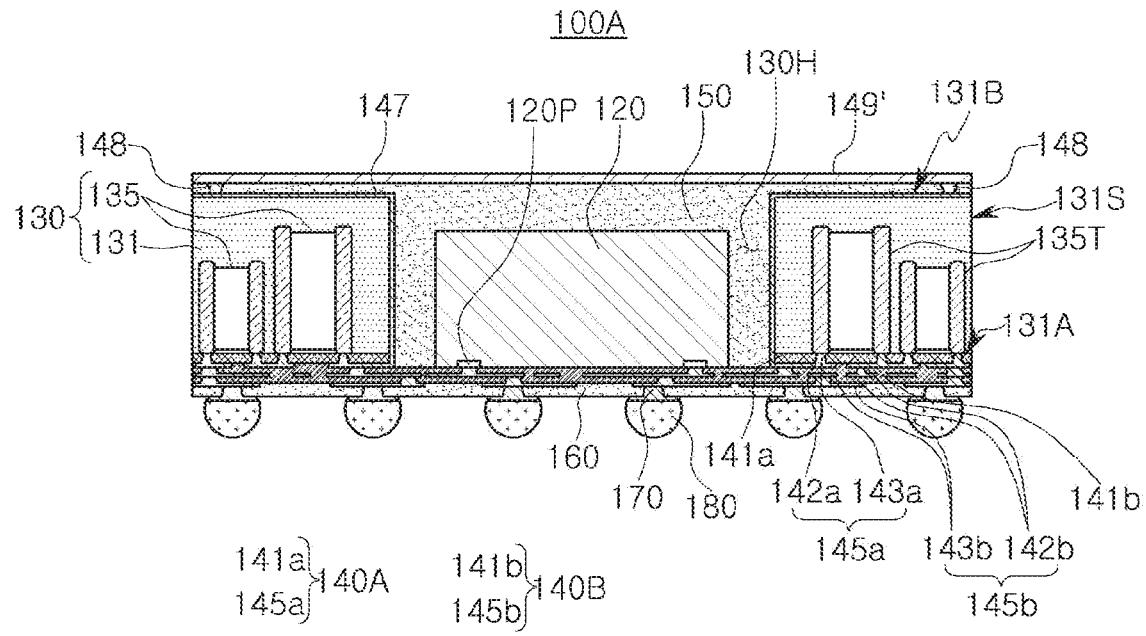
Figure 21:
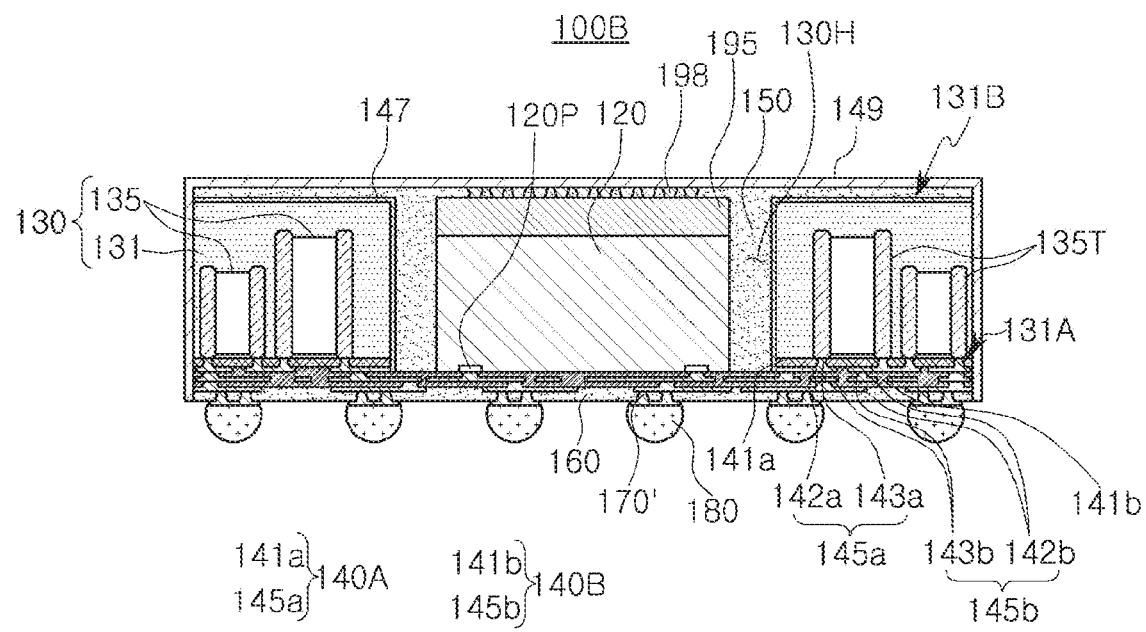
Figure 22:
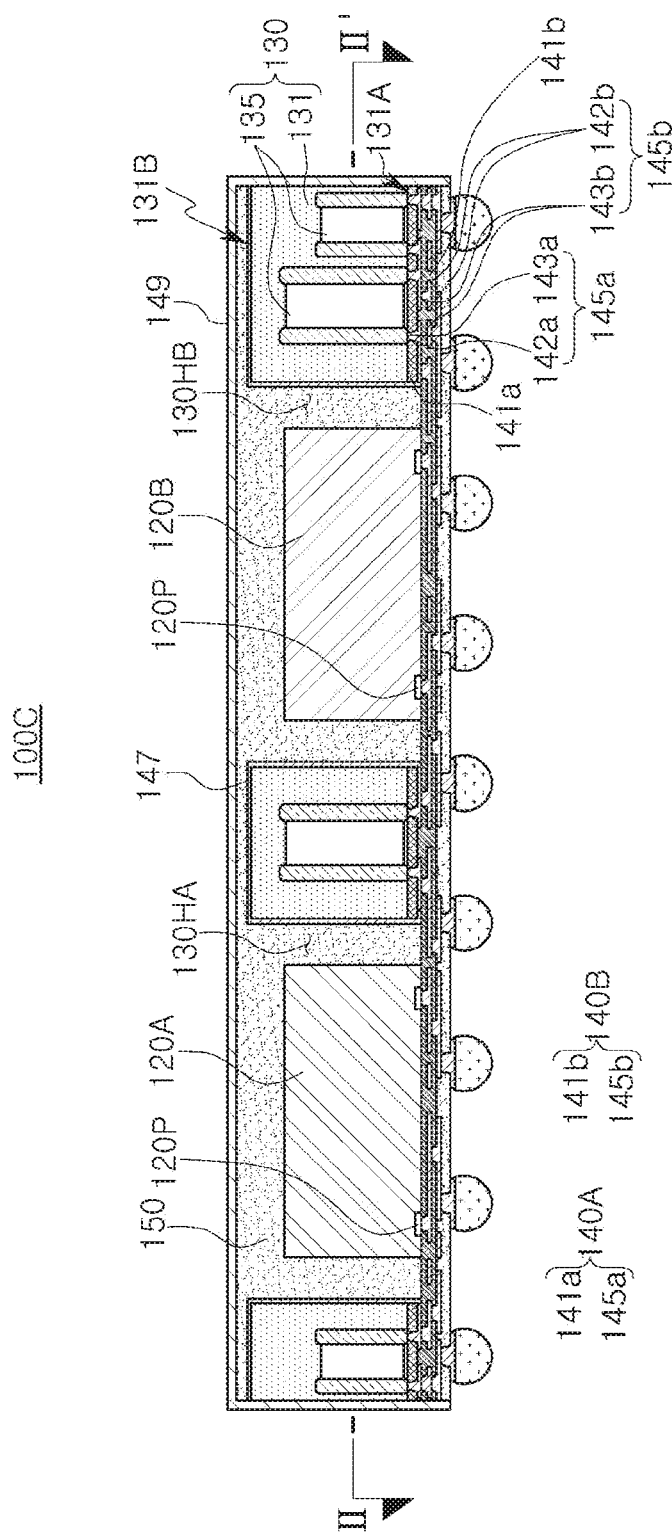
Figure 23:
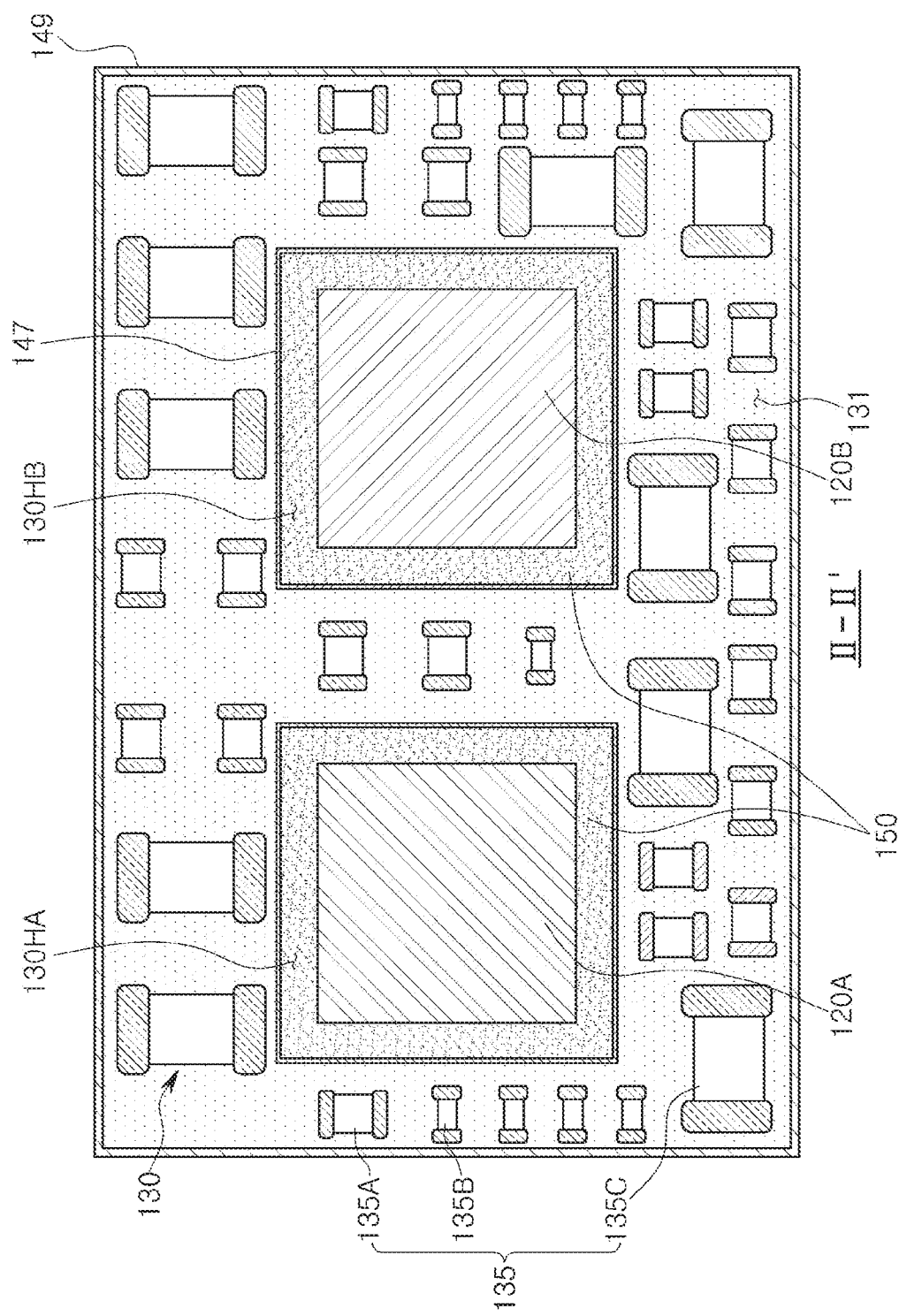

Each of FIGS. 20 and 21 is a schematic cross-sectional view of a semiconductor package according to various example embodiments of the present disclosure;

FIG. 22 is a schematic cross-sectional view of a semiconductor package according to an example embodiment of the present disclosure; and FIG. 23 is a plan view of the semiconductor package of FIG. 22 taken along line II-II'.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' 'connected to,' or 'coupled to' another element, it can be directly 'on,' 'connected to,' or 'coupled to' the other element or other elements intervening therebetween may be present. In contrast, when an element is referred to as being 'directly on,' 'directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' 'upper,' 'below,' and 'lower' and the like, may be used herein for ease of description to describe one element's relationship, relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

Figure 1:
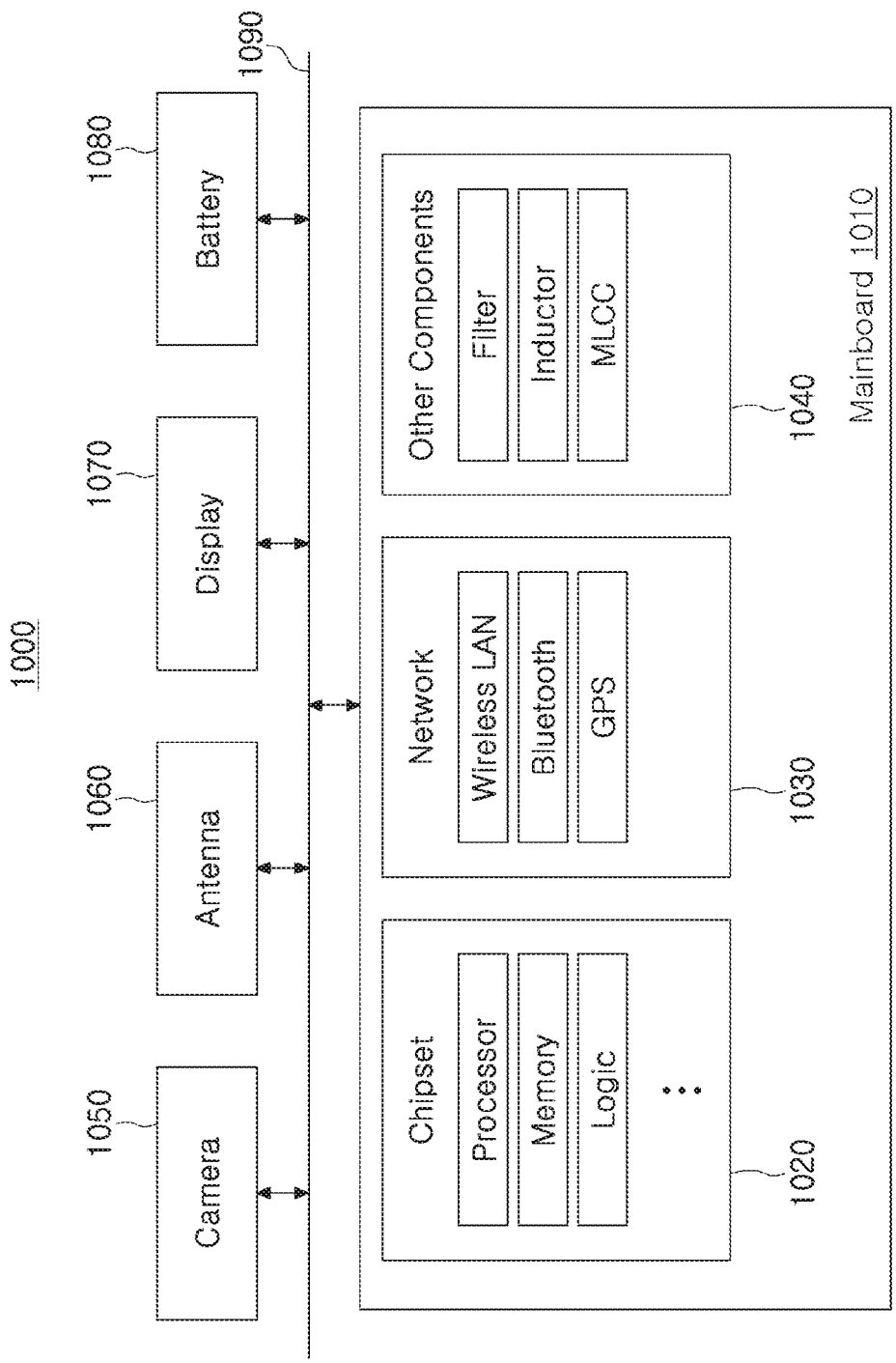
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, or the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, and may include other types of chip related components. In addition, the chip-related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
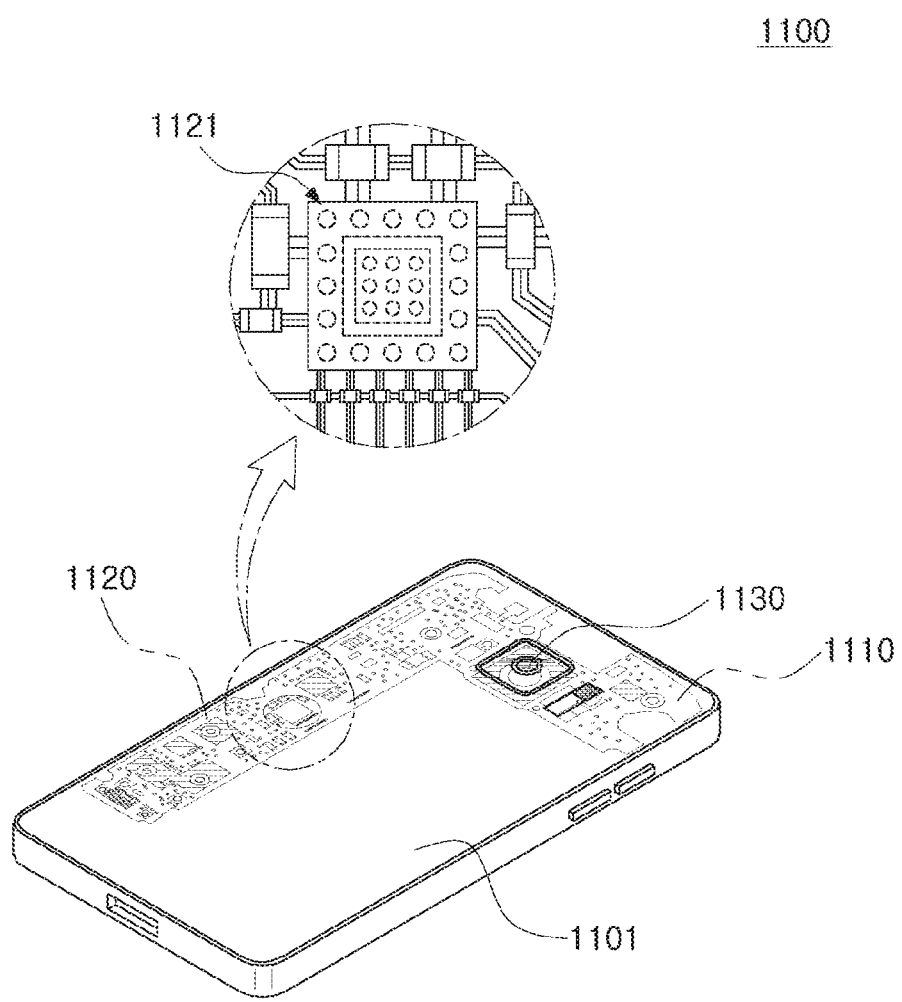
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be chip related components, and a semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the attached drawings.

Fan-In Semiconductor Package

Figure 3B:
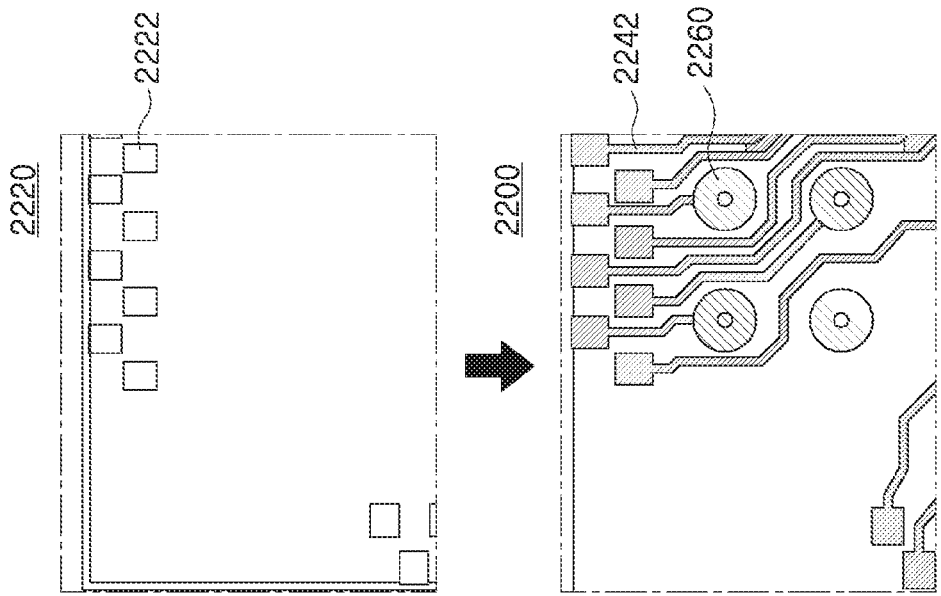
FIGS. 3A and 3B are schematic cross-sectional views illustrating states of a fan-in semiconductor package before and after being packaged.
Figure 3A:
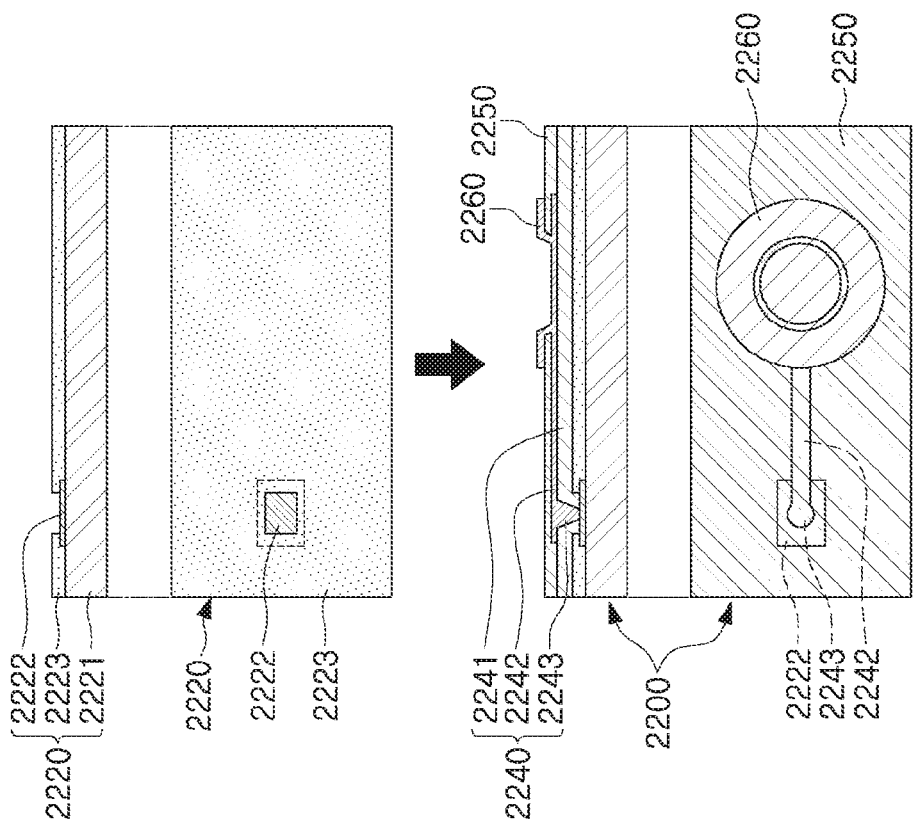
Figure 4:
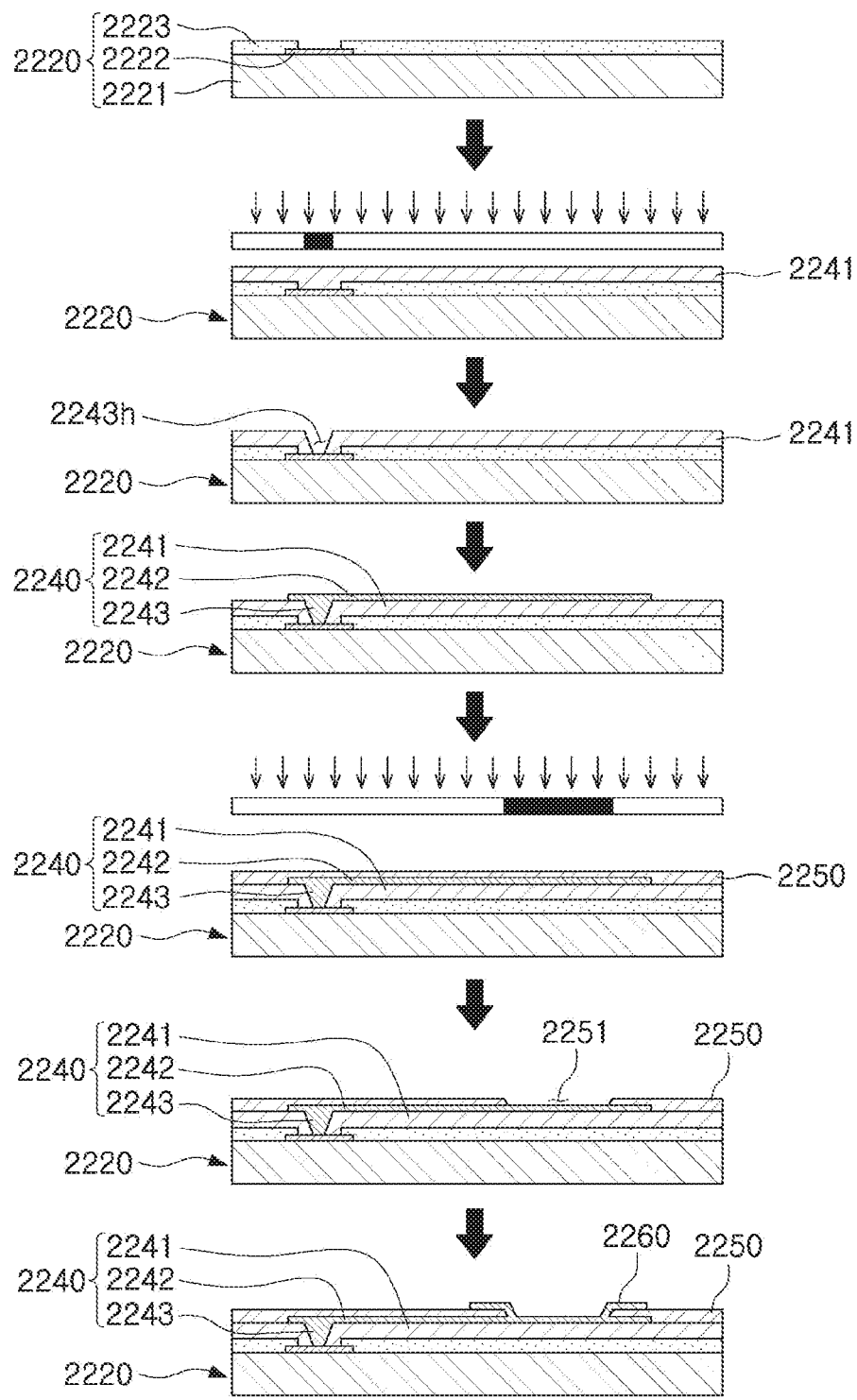
FIG. 4 is schematic cross-sectional views illustrating a packaging process of a fan-in semiconductor package.

FIG. 3 are schematic cross-sectional views illustrating states of a fan-in semiconductor package before and after being packaged, and FIG. 4 are schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed, depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photo imagable dielectric (PID) resin, forming via holes 2243h exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
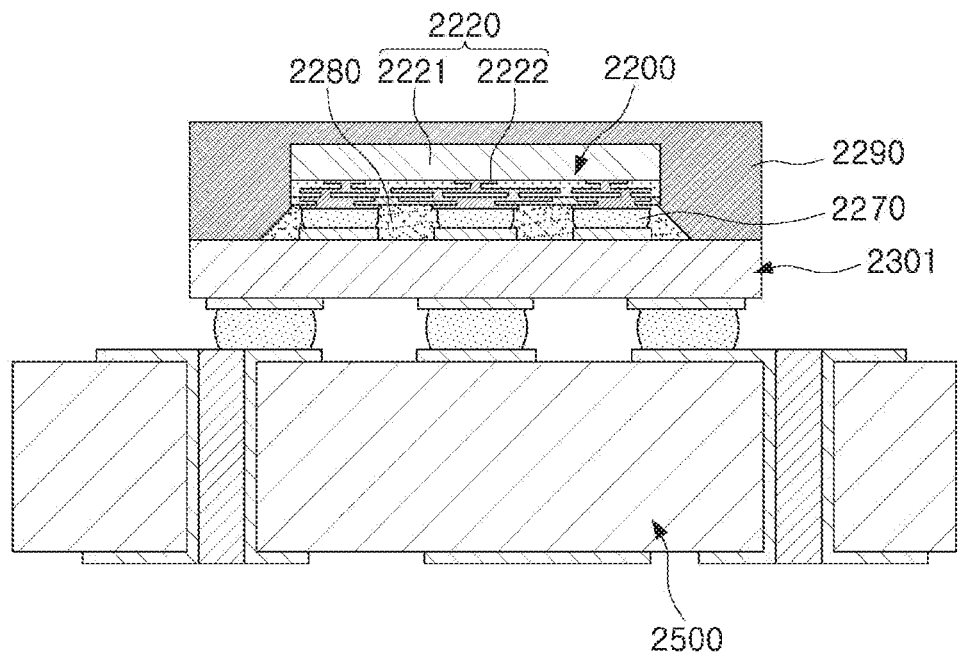
FIG. 5 is a schematic cross-sectional view illustrating a case in which a fan-in semiconductor package is mounted on an interposer substrate and is ultimately mounted on a mainboard of an electronic device.
Figure 6:
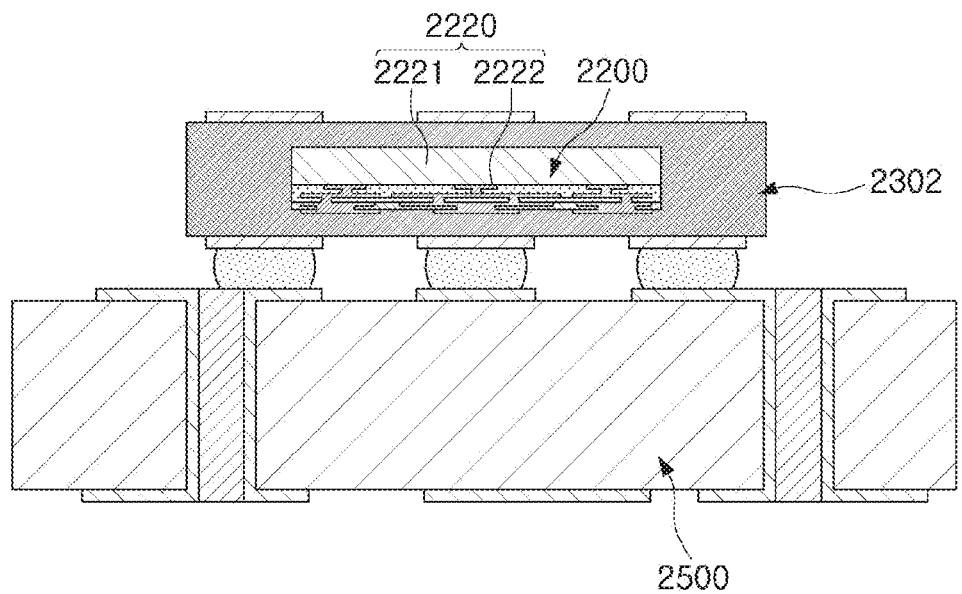
FIG. 6 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, low melting point metal or alloy balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
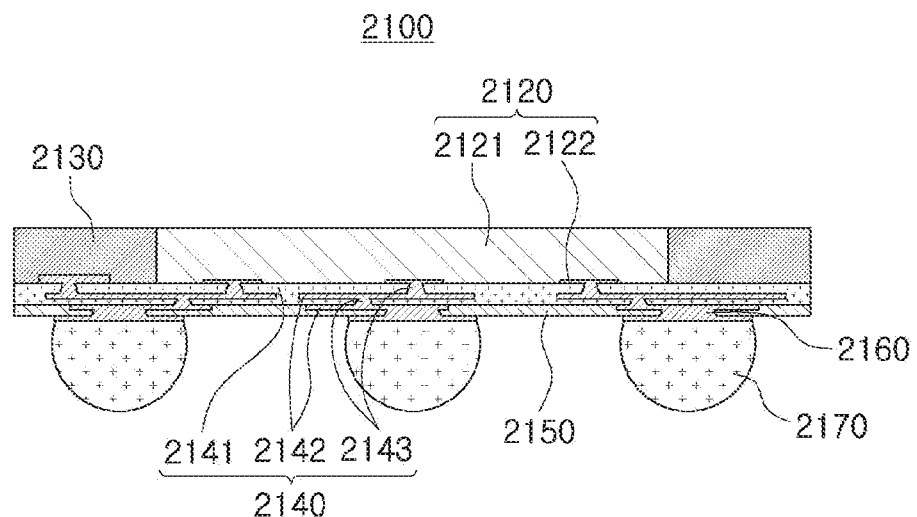
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the manufacturing process described above, after the encapsulant 2130 is formed outside of the semiconductor chip 2120, the connection member 2140 may be provided. In this case, since forming the connection member 2140 is performed after the semiconductor chip 2120 is sealed, the via 2143, connected to a redistribution layer, may be formed to have a width which becomes smaller toward the semiconductor chip 2120 (See an enlarged area).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
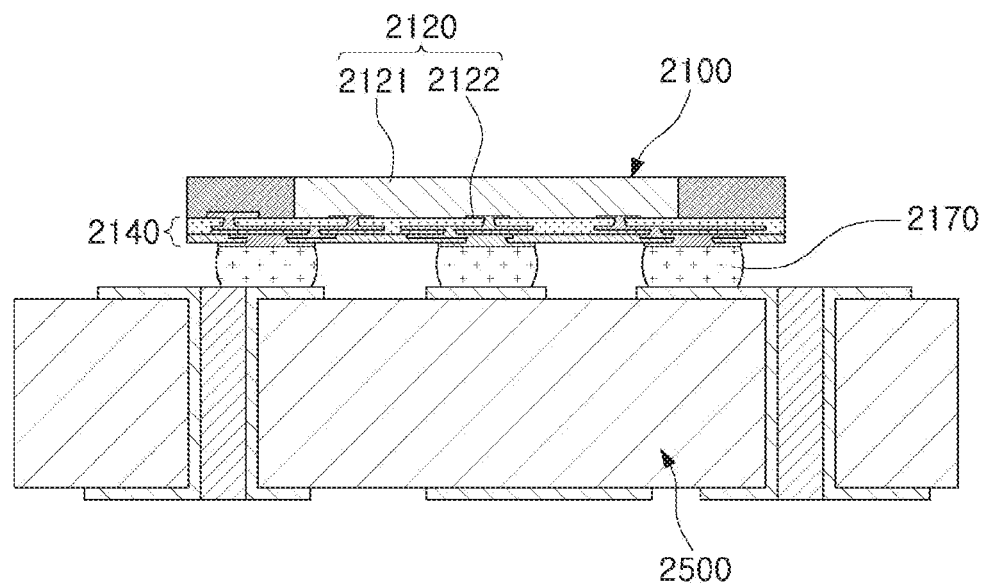
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
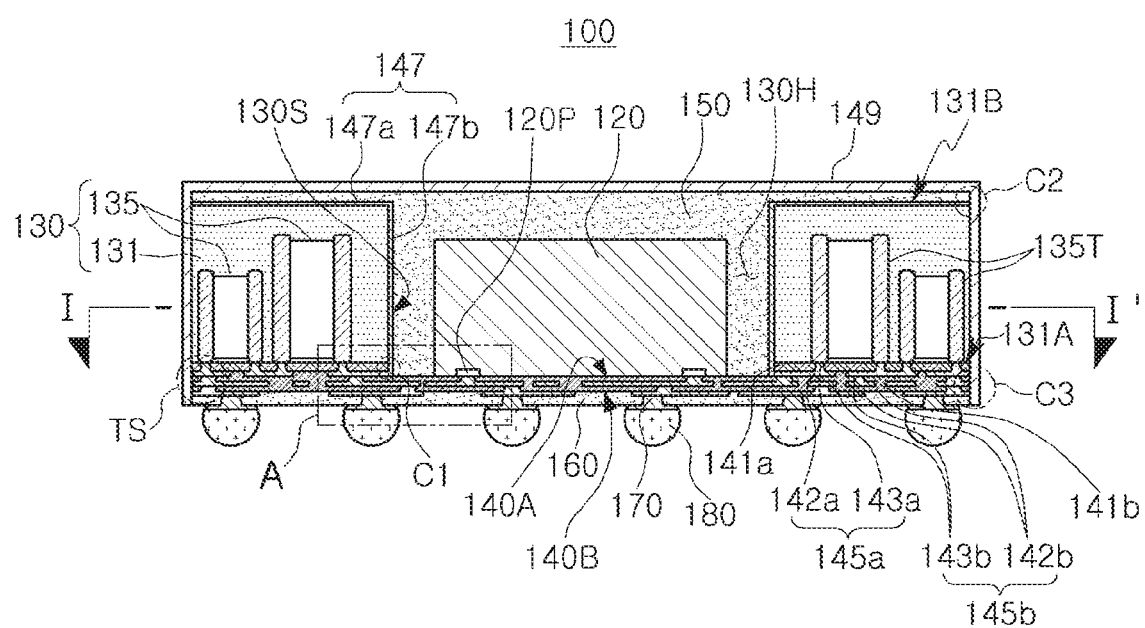
FIG. 9 is a schematic cross-sectional view of a semiconductor package according to an example embodiment of the present disclosure.
Figure 10:
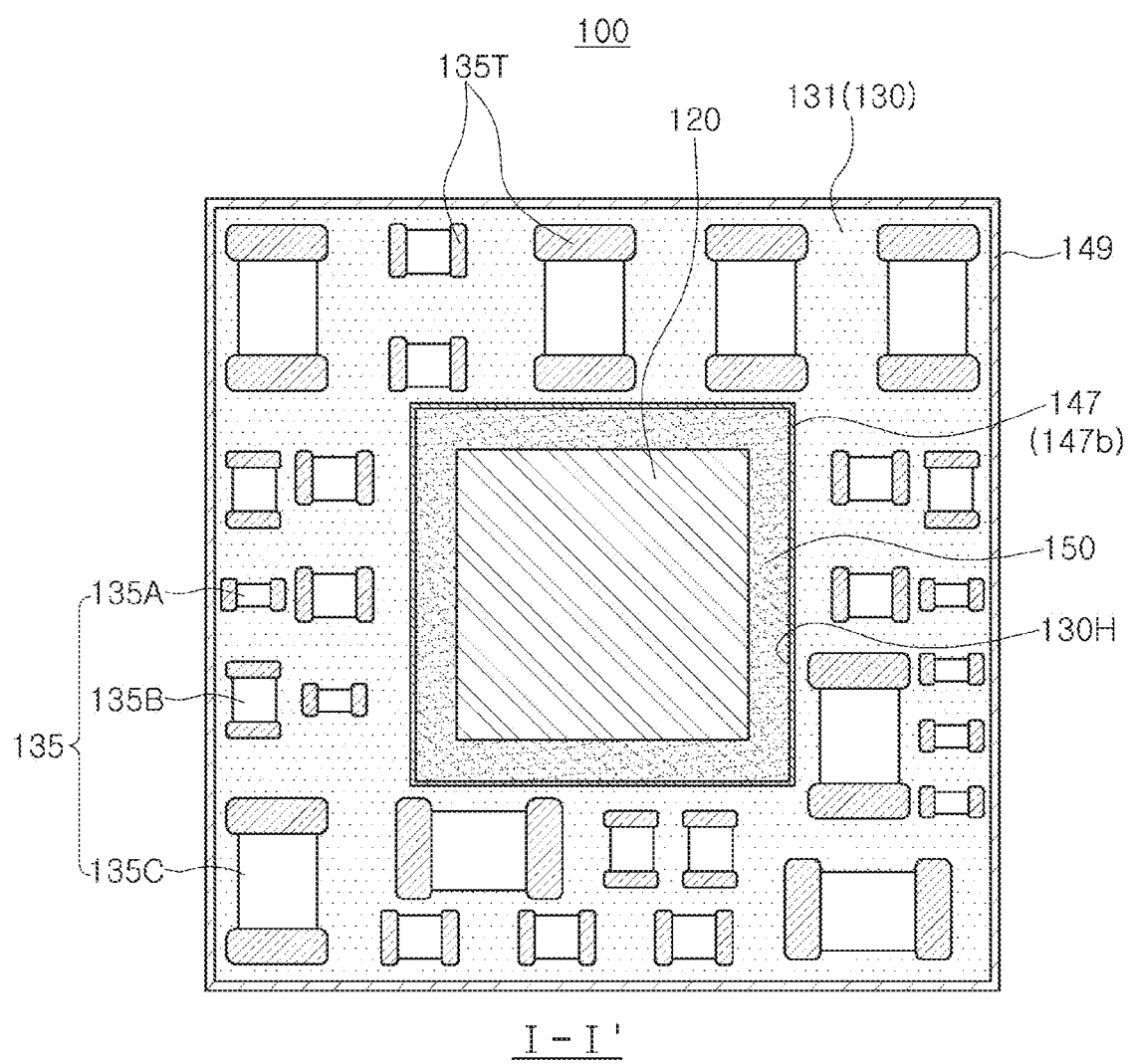
FIG. 10 is a plan view of the semiconductor package of FIG. 9 taken along line I-I'.

FIG. 9 is a schematic cross-sectional view of a semiconductor package according to an example embodiment of the present disclosure, and FIG. 10 is a plan view of the semiconductor package of FIG. 9 taken along line I-I'.

Referring to FIGS. 9 and 10, a semiconductor package 100 according to an example embodiment may include a support member 130, a first connection member 140A, a second connection member 140B, a semiconductor chip 120, and an encapsulant 150.

The support member 130 may have a resin body 131 having a first surface 131A and a second surface 131B, opposing each other, as well as a plurality of passive components 135 embedded in the resin body 131. The resin body 131 may have a cavity 130H, connecting the first surface 131A to the second surface 131B. The support member 130 may replace a core member according to the related art, and may be provided as a support of the semiconductor package 100.

The resin body 131 may be provided as a support of the semiconductor package 100 having the cavity 130H, while embedding the plurality of passive components 135. The plurality of passive components 135 may include a first passive component 135A, a second passive component 135B, and a third passive component 135C, having different sizes and capacities. The resin body 131, employed in an example embodiment, may include an insulating material, for example, a thermosetting resin such as an epoxy resin, or a thermoplastic resin such as polyimide. The resin body 131 may include a material the same as or similar to that of the encapsulant 150. In a specific example, the resin body 131 may include a resin containing a reinforcing material such as an inorganic filler to have rigidity, for example, an Ajinomoto build-up film (ABF), an FR-4 resin, a bismaleimide triazine (BT) resin, an epoxy molding compound (EMC), or the like. It can be understood that the resin body 131 is different from a core member according to the related art in that the resin body is configured to be substantially uniform with a resin having a single composition in almost all areas except for the passive components.

The connection member, employed in an example embodiment, may include a first connection member 140A for redistributing a plurality of passive components 135 embedded in the resin body 131, and a second connection member 140B for redistributing the first connection member 140A to the semiconductor chip 120. The first connection member 140A may have an area corresponding to that of the support member 130, while the second connection member 140B may be provided to have an area corresponding to that of the semiconductor package 100.

Figure 11:
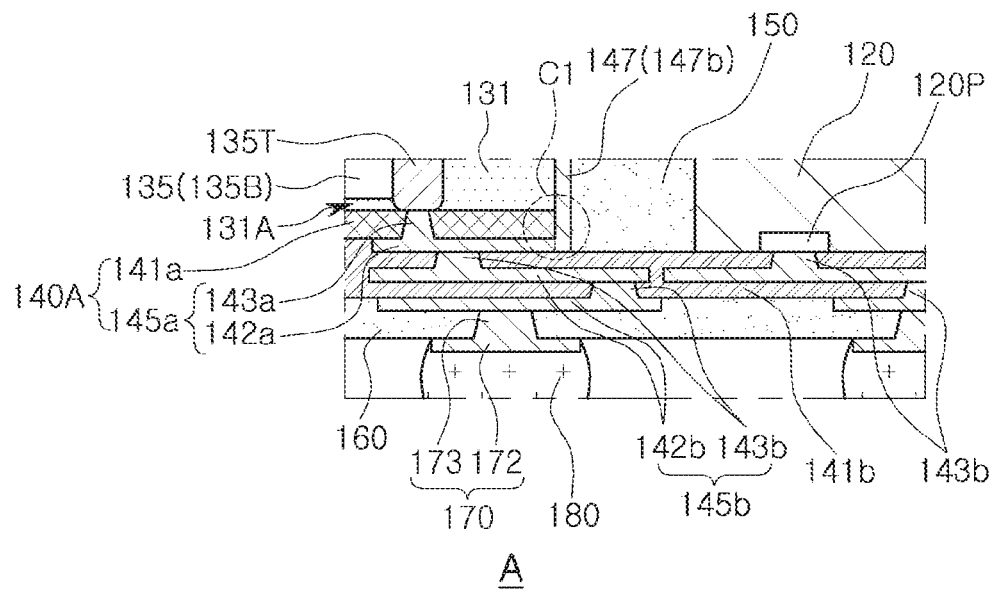
FIG. 11 is an enlarged cross-sectional view illustrating portion A of the semiconductor package of FIG. 9.
Figure 12:
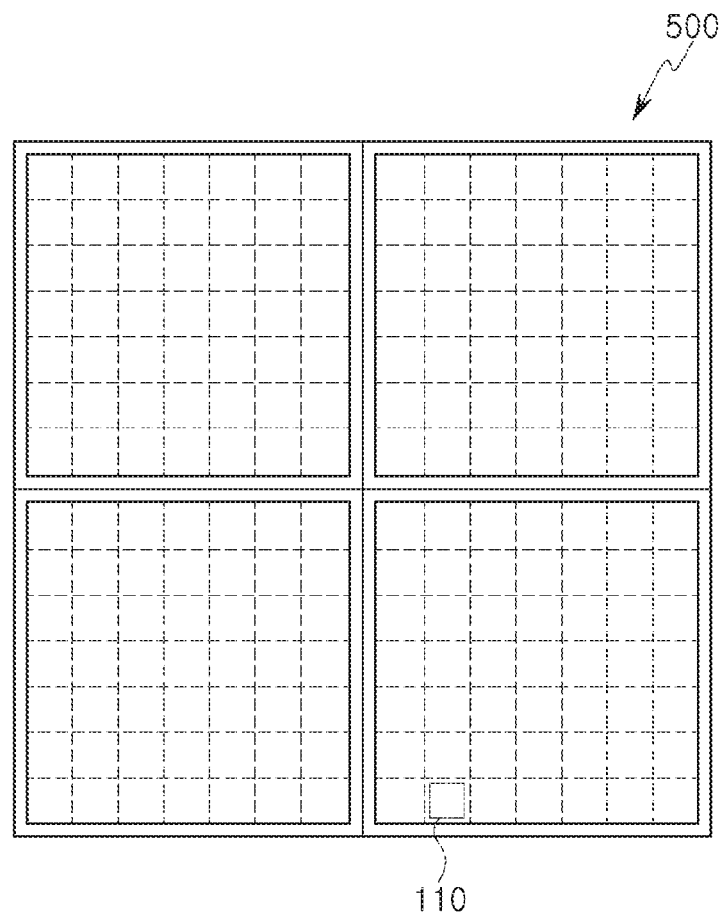
FIG. 12 is a schematic cross-sectional view illustrating an example of a panel used for manufacturing the semiconductor package of FIG. 9.

Hereinafter, referring to FIG. 11, the features of configurations related to the first connection member 140A and the second connection member 140B, employed in an example embodiment, will be described in detail. FIG. 11 is an enlarged cross-sectional view illustrating portion A of the semiconductor package of FIG. 9.

Referring to FIG. 11 together with FIG. 9, the first connection member 140A may include a first insulating layer 141a disposed on a first surface 131A of the resin body 131, and a first redistribution layer 145a connected to a connection terminal 135T of the plurality of passive components 135. The second connection member 140B may include a second insulating layer 141b disposed on the first connection member 140A to cover one surface of the cavity 130H, and a second redistribution layer 145b disposed in the second insulating layer 141b and connected to the first redistribution layer 145a. The semiconductor chip 120, disposed in the cavity 130H, may be disposed on the second connection member 140B, and a connection pad 120P of the semiconductor chip 120 may be connected to the second redistribution layer 145b.

The first redistribution layer 145a may include a first redistribution pattern 142a and a first redistribution via 143a connected thereto, and the second redistribution layer 145b may include a second redistribution pattern 142b and a second redistribution via 143b connected thereto. In an example embodiment, the first redistribution layer 145a may be configured to be a single level, and the second redistribution layer 145b may be configured to be two levels, by way of example, but an example embodiment is not limited thereto. For example, the second redistribution layer 145b may be configured to be a single level, or may be configured to be three or more levels.

As illustrated in FIG. 11, the first surface 131A of the resin body 131 may be located on a level higher than a level of an active surface (that is, a surface having the connection pad 120P provided thereon) of the semiconductor chip 120. For example, the first surface 131A of the resin body 131 may be located on a level approximately as high as a thickness of the first connection member 140A. Meanwhile, the first connection member 140A and the active surface of the semiconductor chip 120 may be disposed on the same working surface (referring to FIG. 17B), so a lower surface of the first connection member 140A may be located to have substantially the same level as that of the active surface of the semiconductor chip 120. In other words, in the semiconductor package 100 according to an example embodiment, the lower surface of the first connection member 140A may be substantially coplanar with the active surface of the semiconductor chip 120.

The first insulating layer 141a and the second insulating layer 141b may be formed of various insulating materials. For example, the first insulating layer 141a and the second insulating layer 141b may include a thermosetting resin such as an epoxy resin, and a thermoplastic resin such as a polyimide resin. In a specific example, the first insulating layer 141a and the second insulating layer 141b may include prepreg, an Ajinomoto build-up film (ABF), an FR-4 resin, a bismaleimide triazine (BT) resin, a photo imagable dielectric (PID) material, or the like.

In an example embodiment, the first insulating layer 141a for the first connection member 140A may be formed of an insulating material different from that of the second insulating layer 141b for the second connection member 140B.

When a photo imagable dielectric (PID) material is used as the insulating layer for the connection member, undesired undulation (for example, 15 μm or more) may occur due to protrusion caused by the connection terminal 135T of the passive component 135 in general. Therefore, there may be inconvenience in using a PID film having a large thickness, and there may be a problem in which cracking easily occurs due to having such a large thickness.

In one example, as the first insulating layer 141a of the first connection member 140A, a non-photo imagable dielectric material, including a reinforcing material such as an inorganic filler other than PID, may be used. On the other hand, as the second insulating layer 141b of the second connection member 140B, PID may be used. In the case of the second insulating layer 141b, PID, fine vias may be provided at fine pitches using a photolithography process, so tens to millions of connection pads 120P of the semiconductor chip 120 may be efficiently redistributed.

The semiconductor package 100 according to an example embodiment may introduce various types of shielding devices for an Electromagnetic Interference (EMI) shielding effect. Such a shielding device may also be used as a heat dissipating device.

The shielding device, employed in an example embodiment, may include a first shielding layer 147 disposed on a surface of the resin body 131. As illustrated in FIG. 9, the first shielding layer 147 may include a first portion 147a disposed on the second surface 131B of the resin body 131, and a second portion 147b disposed on an inner sidewall 130S of the cavity 130H.

The first shielding layer 147, as illustrated in FIG. 11, may extend along the inner sidewall 130S of the cavity 130H to be connected to the first redistribution layer 145a (referring to "C1"). Through the connection described above, the first shielding layer 147 may be grounded to the first redistribution layer 145a.

The first shielding layer 147 may be provided using a plating process, and such a plating process may be performed together with a plating process for the first redistribution layer 145a. The first portion 147a, disposed on the second surface 131B of at least the resin body 131, may be plated to a thickness substantially equal to the thickness of the first redistribution pattern 142a. For example, the first shielding layer 147 may include a metal layer such as copper.

The semiconductor package 100 according to an example embodiment may include an encapsulant 150 encapsulating the semiconductor chip 120 located in the cavity 130H and covering the second surface 131B of the resin body 131. The encapsulant 150 may fill a space between the inner sidewall 130S of the cavity 130H and the semiconductor chip 120 to stably support the semiconductor chip 120.

For example, the encapsulant 150 may include a thermosetting resin such as an epoxy resin, a thermoplastic resin such as polyimide, or the like. In a specific example, as the encapsulant 150, prepreg, ABF, an FR-4 resin, a BT resin, a PID material, or the like, may be used.

The semiconductor package 100 according to an example embodiment may further include a second shielding layer 149 disposed on an upper surface of the encapsulant 150. The second shielding layer 149 may be connected to the first shielding layer 147 (referring to "C2"). In an example embodiment, as illustrated in FIG. 9, the second shielding layer 149 may extend along a side surface of the resin body 131 to be connected to the first shielding layer 147 on a side surface of the resin body 131.

The second connection member 140B may further include a trench stack TS for shielding, disposed along an edge of the second insulating layer 141b. The trench stack TS may include a trench located in each level of the second insulating layer 141b in a manner similar to the second redistribution via 143b, and may have a stack structure connected in a position in which trenches located in respective levels (two levels in an example embodiment) overlap. The trench stack TS may have a shape surrounding an edge of the second insulating layer 141b when viewed on a plane. The trench stack TS may be provided in a process of forming the second redistribution layer 145b.

As illustrated in FIG. 9, the second shielding layer 149 may extend along a side surface of the resin body 131 to be connected to the first shielding layer 147 and the trench stack TS. Through the connection described above, the second shielding layer 149 may be grounded to the second redistribution layer 145b. The second shielding layer 149 may be provided using a deposition process such as sputtering in addition to a plating process. For example, the second shielding layer 149 may be copper or an alloy such as stainless steel (SUS).

The semiconductor package 100 according to an example embodiment may include a passivation layer 160 disposed on a lower surface of the second connection member 140. The passivation layer 160 may have a plurality of openings exposing a portion of the second redistribution layer 145b. An under bump metallurgy (UBM) layer 170 may be disposed in an opening of the passivation layer 160 and may be connected to the second redistribution layer 145b, and the UBM layer 170 may include a UBM pad disposed on the passivation layer 160 and a UBM via 173 connecting the UBM pad to a portion of the second redistribution layer 145b (referring to FIG. 11). The UBM layer 170 is provided with an electrical connection structure 180 formed thereon, and thus may be connected to an external circuit such as a motherboard, or the like.

Hereinafter, a main configuration of the semiconductor package 100 according to an example embodiment will be described in more detail.

The semiconductor chip 120 may be formed on the basis of an active wafer. A body of the semiconductor chip 120 may include silicon (Si), germanium (Ge), gallium arsenide (GaAs), or the like. The connection pad 120P may electrically connect the semiconductor chip 120 to other components, and may include a metal such as aluminum (Al). A passivation layer (not illustrated) exposing the connection pad 120P may be formed on a body, and may be an oxide layer, a nitride layer, or the like, or a double layer of an oxide layer and a nitride layer.

The semiconductor chip 120 may be an integrated circuit (IC) provided in an amount of several hundred to several million or more elements integrated in a single chip. For example, the semiconductor chip 120 may be a processor such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, but the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like. Moreover, these chip related components may also be combined.

The plurality of passive components 135 may be a discrete component such as a multilayer ceramic capacitor (MLCC), a low inductance chip capacitor (LICC), a power inductor, a bead, or the like. As described previously, the plurality of passive components 135A, 135B, and 135C may have different thicknesses, and may have a thickness different from a thickness of the semiconductor chip 120. The type of the passive components 135 and the number thereof are not particularly limited. In addition, the passive components 135 may have various arrangements and may be arranged more or less densely than the arrangement illustrated in FIG. 10.

The first redistribution pattern 142a and the second redistribution pattern 142b, employed in the first connection member 140A and the second connection member 140B, may perform various functions depending on designs of their corresponding layers. For example, the first redistribution pattern 142a and the second redistribution pattern 142b may include ground (GND) patterns, power (PWR) patterns, signal (S) patterns, and the like. Here, the S pattern may include various signals except for a GND pattern, a PWR pattern, or the like, for example, data signals, or the like. In addition, the S pattern may include pad patterns for vias, pad patterns for electrical connection structures, and the like. For example, the first redistribution pattern 142a and the second redistribution pattern 142b may include a conductive material such as copper (Cu), aluminum (Al), silver (Ag), tin (Sn), gold (Au), nickel (Ni), lead (Pb), titanium (Ti), or alloys thereof. For example, a thickness of each of the first redistribution pattern 142a and the second redistribution pattern 142b may be, for example, from about 0.5 µm to about 15 µm.

The first redistribution via 143a and the second redistribution via 143b may be used as an element (an interlayer connection element), for connecting element located on different levels (for example, a conductive trace and redistribution patterns or redistribution patterns of other insulating layers) in a vertical direction. For example, the first redistribution via 143a and the second redistribution via 143b may include a conductive material such as copper (Cu), aluminum (Al), silver (Ag), tin (Sn), gold (Au), nickel (Ni), lead (Pb), titanium (Ti), or alloys thereof.

Each of the first redistribution via 143a and the second redistribution via 143b may be completely filled with the conductive material, or the conductive material may also be formed along a wall of each of vias. Moreover, the first redistribution via 143a and the second redistribution via 143b may have various other shapes, such as a tapered or cylindrical shape.

The UBM layer 170 may improve connection reliability of the electrical connection structure 180 to improve board level reliability of the semiconductor package 100. As described previously, the UBM layer 170 is disposed in the passivation layer 160 and may be connected to the second redistribution pattern 142b of the second connection member 140B. The electrical connection structure 180 physically or electrically connects the semiconductor package 100 to an external power source. For example, the semiconductor package 100 may be mounted on a main board of an electronic device through the electrical connection structure 180.

The electrical connection structure 180 may be formed of a conductive material, for example, a low melting point alloy such as a tin (Sn)—aluminum (Al)—copper (Cu) alloy, but an example embodiment is not limited thereto. Moreover, the electrical connection structure 180 may be a land, a ball, a pin, or the like, or may be formed as a multilayer structure or a single layer structure.

Here, referring to the drawings (FIGS. 12 to 19), a method for manufacturing a semiconductor package according to an example embodiment of the present disclosure will be described.

During the description of the manufacturing method described above, various features and advantages of the semiconductor package according to an example embodiment will be specifically understood. The method for manufacturing a semiconductor package according to an example embodiment may be largely divided into a process of forming a support member (see FIGS. 13A to 13E) and a process of forming a connection member (see FIGS. 17A to 17E).

Figure 13A:
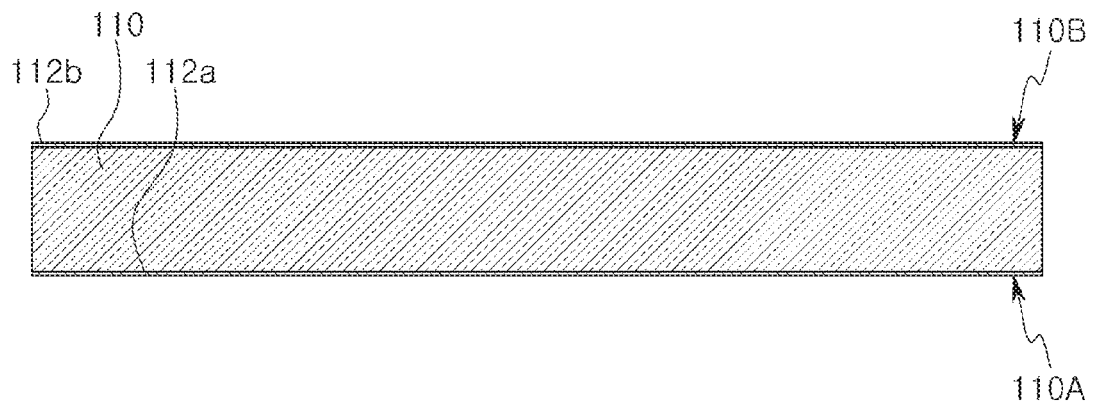
FIGS. 13A to 13E are cross-sectional views of main operations illustrating a process of forming a support member during a method for manufacturing a semiconductor package according to an example embodiment of the present disclosure.
Figure 13B:
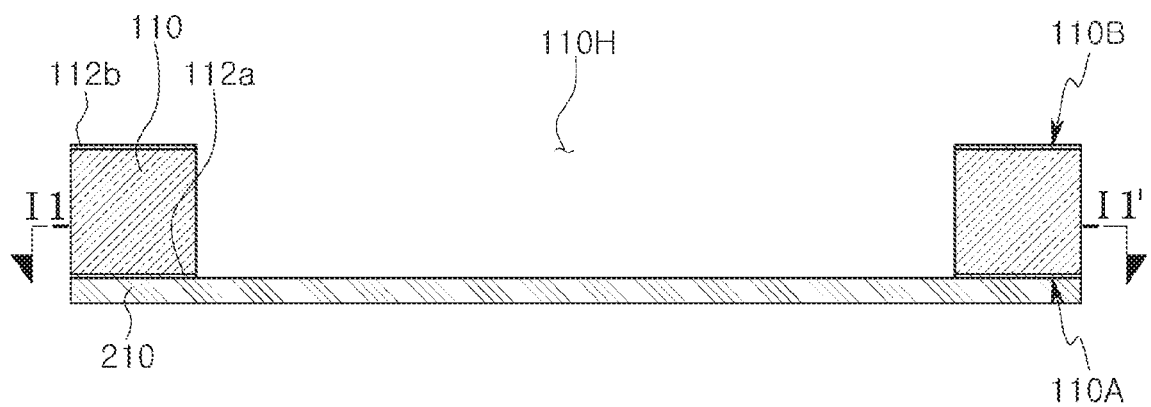
Figure 13C:
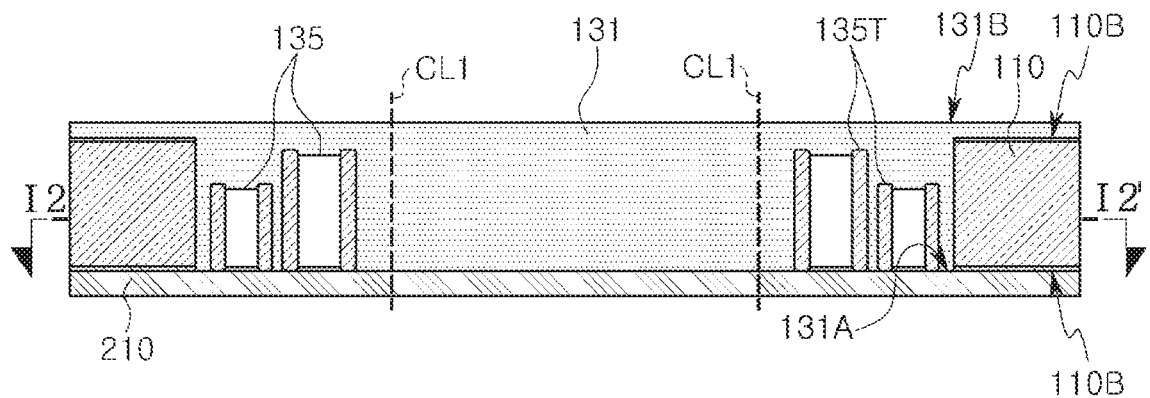
Figure 13D:
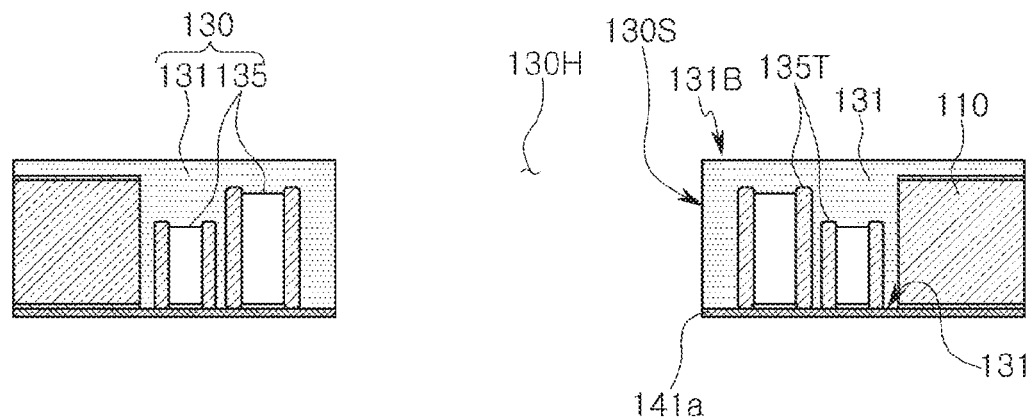
Figure 13E:
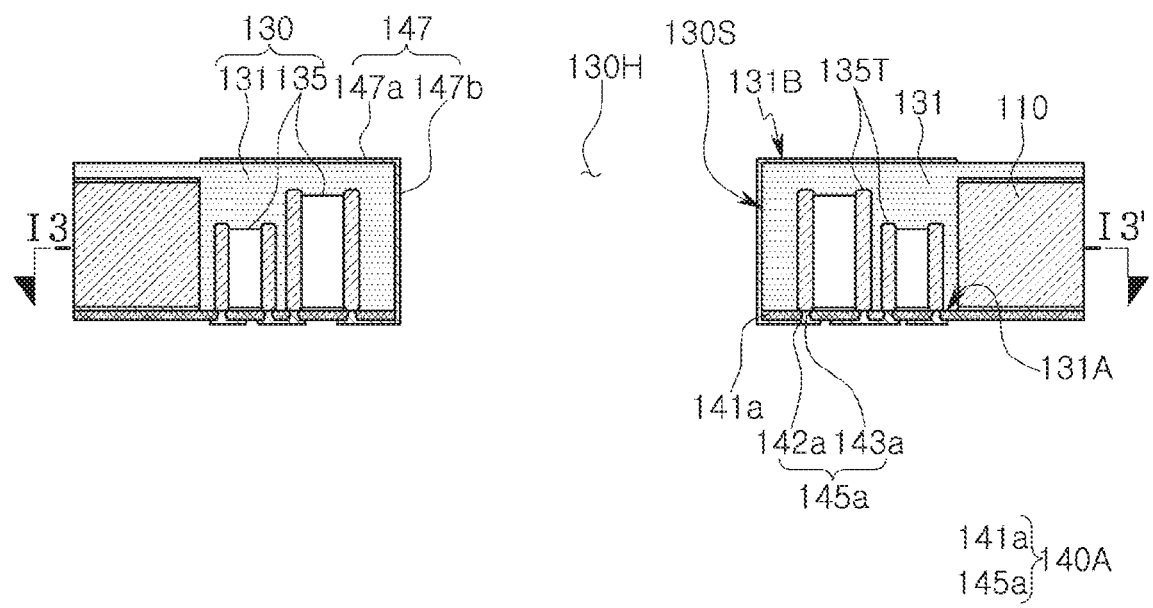
Figure 14:
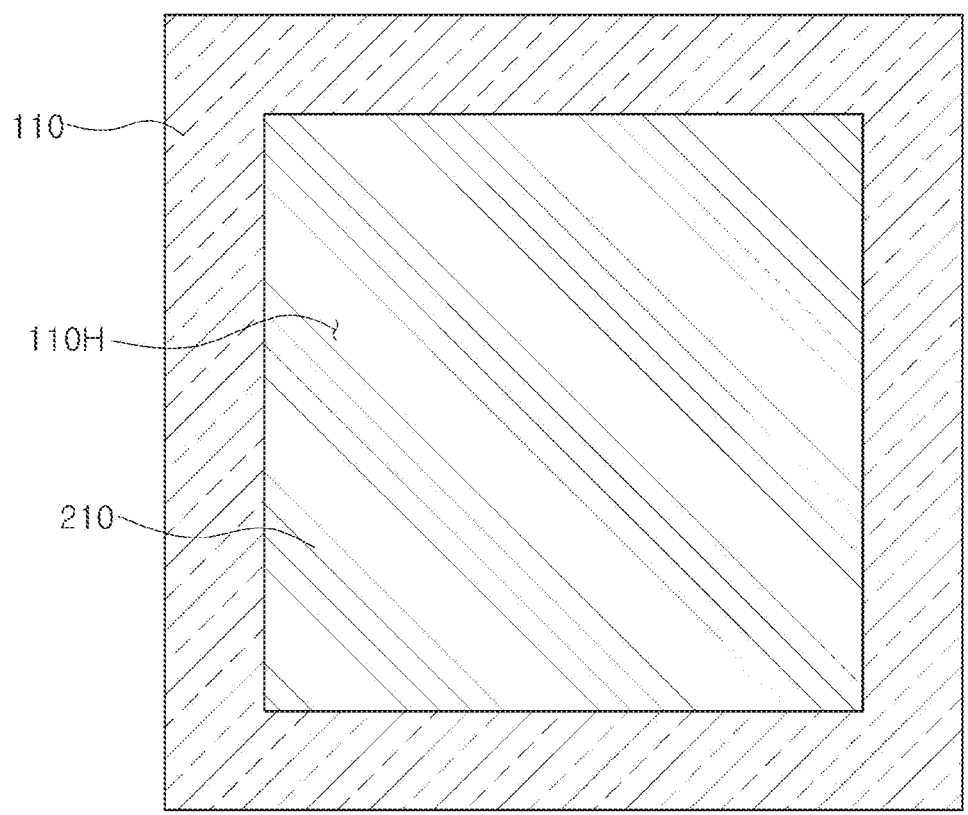
FIGS. 14 to 16 are plan views of results of FIGS. 13B, 13C and 13E, respectively.
Figure 15:
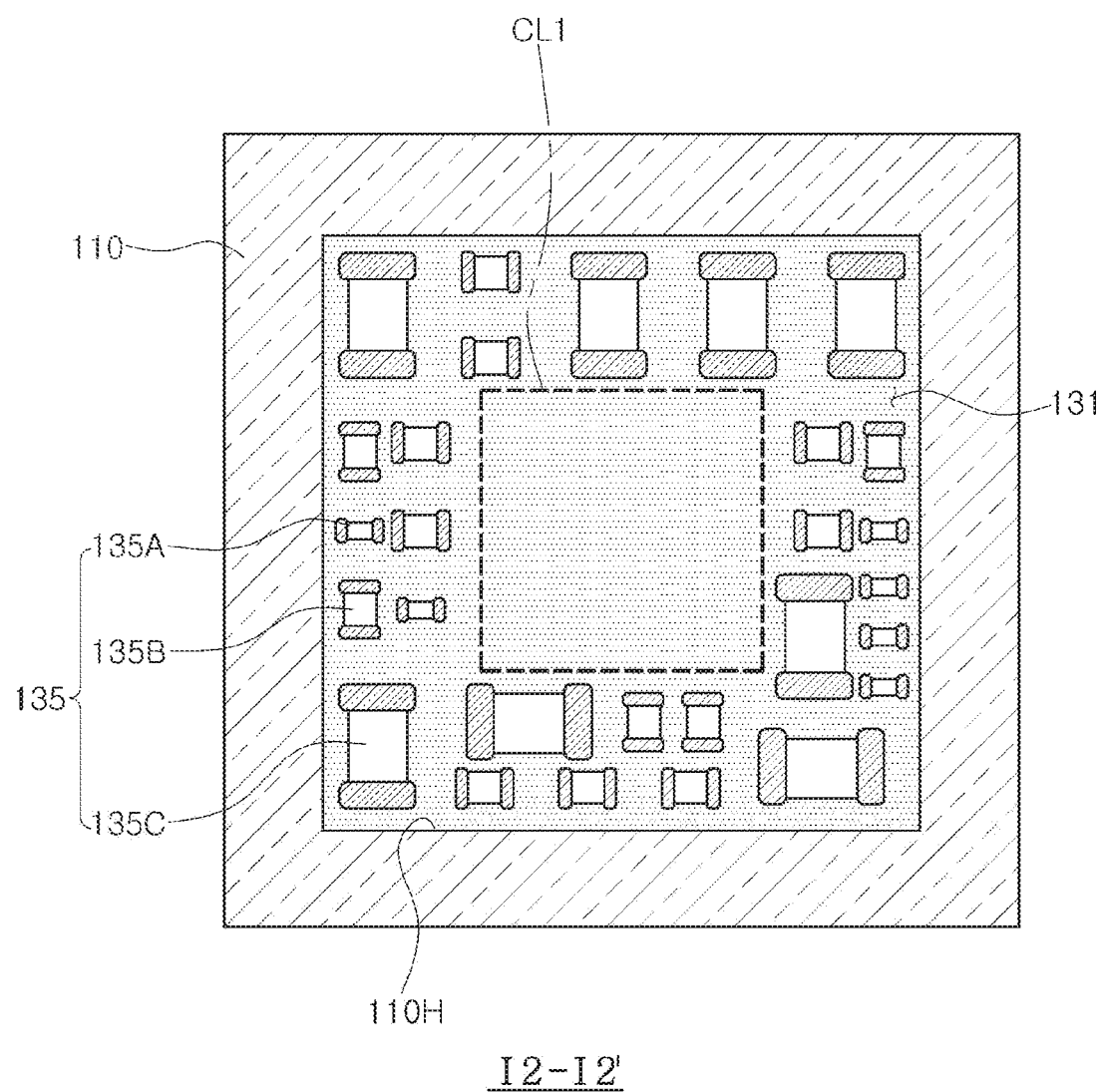
Figure 16:
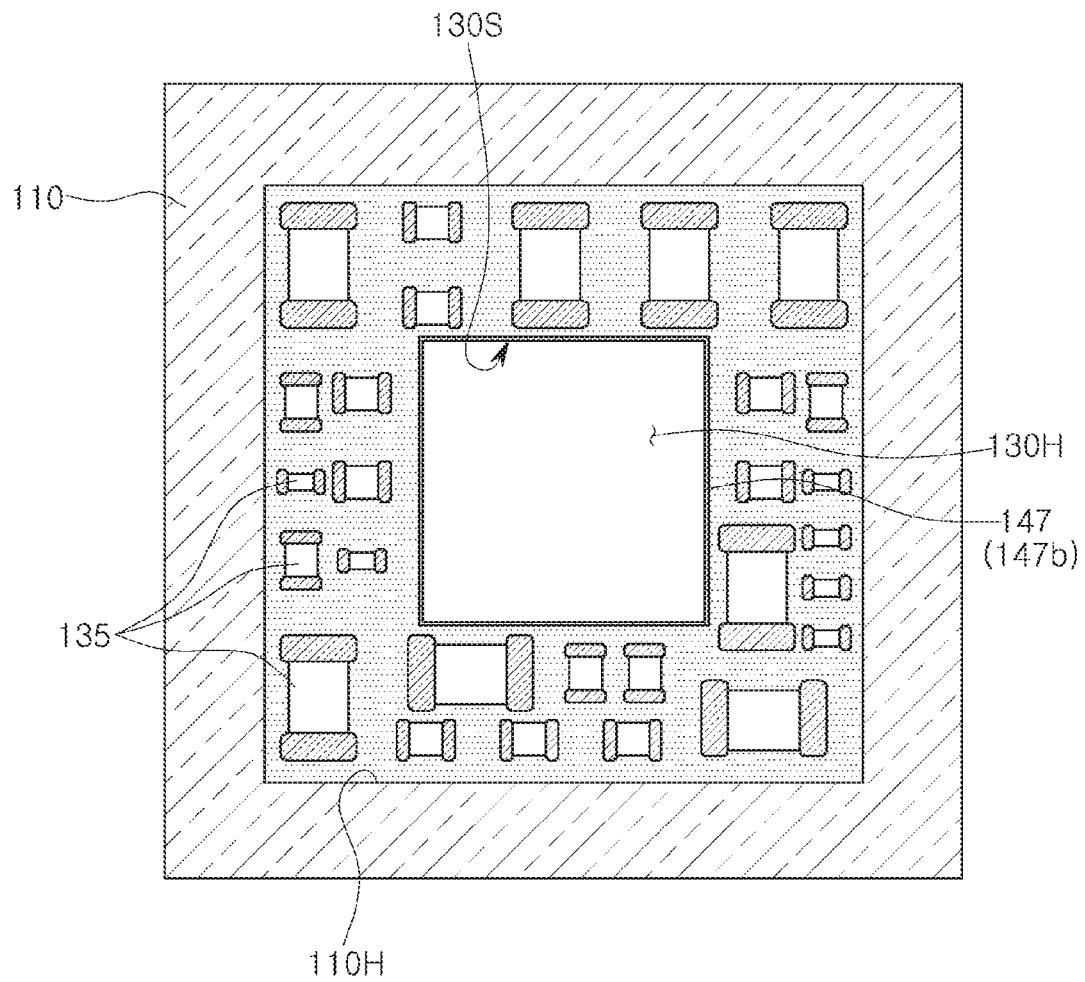

FIGS. 13A to 13E are cross-sectional views of main operations illustrating a process of forming a support member during a method for manufacturing a semiconductor package according to an example embodiment of the present disclosure, while FIGS. 14 to 16 are plan views along line I1-I1' of FIG. 13B, line I2-I2' of 13C, and line I3-I3' of FIG. 13E, respectively.

Referring to FIG. 13A, a core member 110 having a first surface 110A and a second surface 110B, opposing each other, may be provided.

The first surface 110A and the second surface 110B of the core member 110 may be copper clad laminates (CCL) having metal layers 112a and 112b, disposed therein, respectively. The core member 110, illustrated in FIG. 13A, corresponds to a unit of a large panel illustrated in FIG. 12. In other words, each unit of the panel 500 illustrated in FIG. 12 may be understood as a core member 110 related to an individual package illustrated in FIG. 13. As described above, by using the panel 500 having a large area, a large amount of semiconductor packages may be manufactured through a single process, and may be ultimately obtained as individual packages through a cutting process illustrated in FIG. 18.

Then, referring to FIG. 13B, after a cavity for a package 110H is formed in the core member 110, the core member 110 is attached to a first carrier film 210.

A method of forming the cavity for a package 110H may be performed using a laser drilling method, a mechanical drilling method, a sand blasting method, and/or the like. The cavity for a package 110H, as illustrated in FIG. 14, may be a cavity defining a semiconductor package to be manufactured, and may be formed to be larger than a size of a semiconductor package to be manufactured in consideration of a cutting margin, in practice. Then, the first surface 110A of the core member 110 is attached to the first carrier film 210 having adhesiveness. For example, the first carrier film 210 may be an adhesive tape containing an epoxy resin.

Then, referring to FIG. 13C, a plurality of passive components 135 are arranged in the cavity for a package 110H, and the passive components 135, having been arranged, may be encapsulated by applying the resin body 130.

The plurality of passive components 135 may be arranged in a final arrangement form (see FIG. 10) in the resin body 131, in an area other than an area in which the cavity 130H is to be provided. In detail, as illustrated in FIG. 15, the plurality of passive components 135 may be arranged in an edge region of the cavity 130H, that is, in a region in which a support member (or a resin body) is to be provided, and in a subsequent process, a cavity 130H, defined along a first cutting line CL1, may be provided. The resin body 131, provided in the operation described above, may be formed using a method of laminating a film in an uncured state and then curing the film, or a method of applying a liquid resin and then curing the liquid resin. In an example embodiment, the resin body 131 may be provided to cover the second surface 110B of the core member 110. In another example embodiment, the resin body 131 may be formed to have a height, corresponding to a thickness of the cover member 110 or lower than the thickness of the cover member 110.

Then, referring to FIG. 13D, the first carrier film 210 is removed, and a first insulating layer 141a is formed on a surface from which the first carrier film 210 is removed. Then, the cavity 130H, defined along the first cutting line CL1, may be provided.

The removal of the first carrier film 210 may be performed using a known mechanical method. The first insulating layer 141a may be provided on the surface, from which the first carrier film 210 is removed, using a lamination process, or the like. For example, a buildup resin film such as ABF or a resin coated film (RCF) may be used for the lamination process. Moreover, formation of the cavity 130H, in a manner similar to the method of forming the cavity for a package 110H described previously, may be performed using a laser drilling method, a mechanical drilling method, a sand blasting method, and/or the like. As a result, as illustrated in FIG. 16, the resin body 131 having the cavity 130H provided therein may have a plurality of passive components 135 embedded therein, and an outline of the resin body may have a shape surrounded by a core member.

Then, referring to FIG. 13E, the first redistribution layer 145a, connected to the connection terminal 135T of the passive component 135 embedded in the first insulating layer 141a, may be provided.

During formation of the first redistribution layer 145a, a via hole is provided in the first insulating layer 141a to expose the connection terminal 135T of each passive component 135, and a first redistribution pattern 142a and a first redistribution via 143a may be provided using a plating process. Using the operation described above, the first redistribution layer 145a for the passive component 135 embedded in the resin body 131 may be provided. Formation of a via hole may be performed using a laser or a photolithography process. A desmearing process may be applied after formation of the via hole if necessary.

Moreover, in the plating process described above, a plating process is applied to a second surface of the resin body 131 and an inner side surface 130S of the cavity 130H, so the first shielding layer 147 may be provided simultaneously. The first portion 147a, disposed on the second surface 131B of at least the resin body 131, may be plated to a thickness substantially equal to the thickness of the first redistribution pattern 142a. For example, the first redistribution layer 145a and the first shielding layer 147 may include a metal such as copper. A portion 147b of the first shielding layer 147 may extend along the inner sidewall 130S of the cavity 130H to be ground connected to the first redistribution layer 145a. In the plating process described above, a seed layer is provided on a portion of the resin body 131 surrounded by the core member 110, but is not provided on a surface of the core member 110 to be removed from a final package. Thus, as described in FIG. 13E, a plating layer may be formed on the portion of the resin body 131 surrounded by the core member 110 but may not be provided on the core member 110.

Figure 17A:
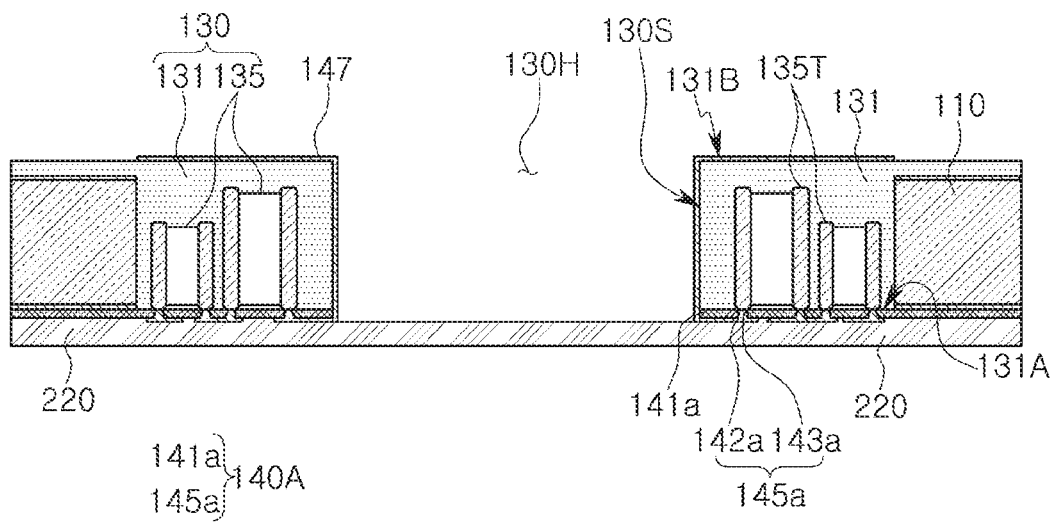
FIGS. 17A to 17E are cross-sectional views of main operations illustrating a process of forming a connection member during a method for manufacturing a semiconductor package according to an example embodiment of the present disclosure.
Figure 17B:
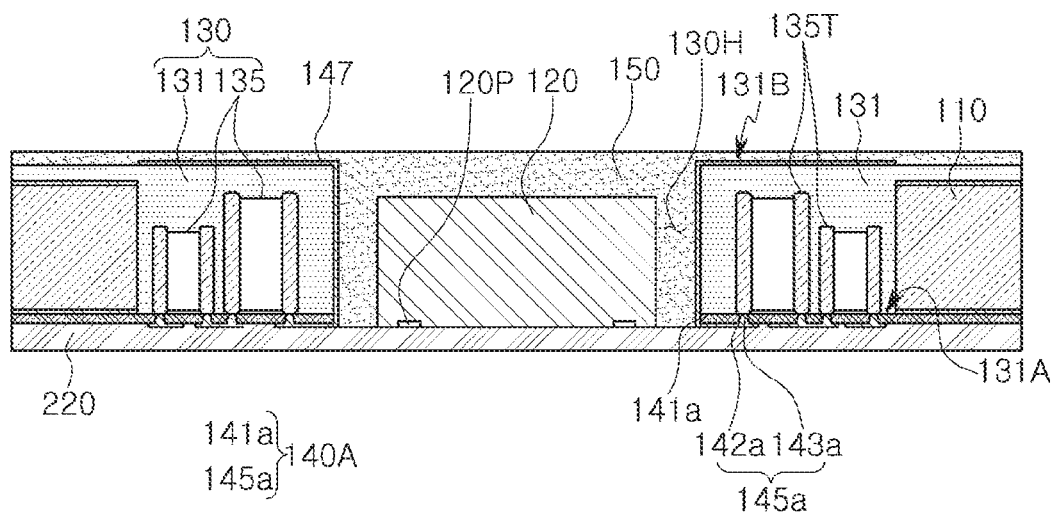
Figure 17C:
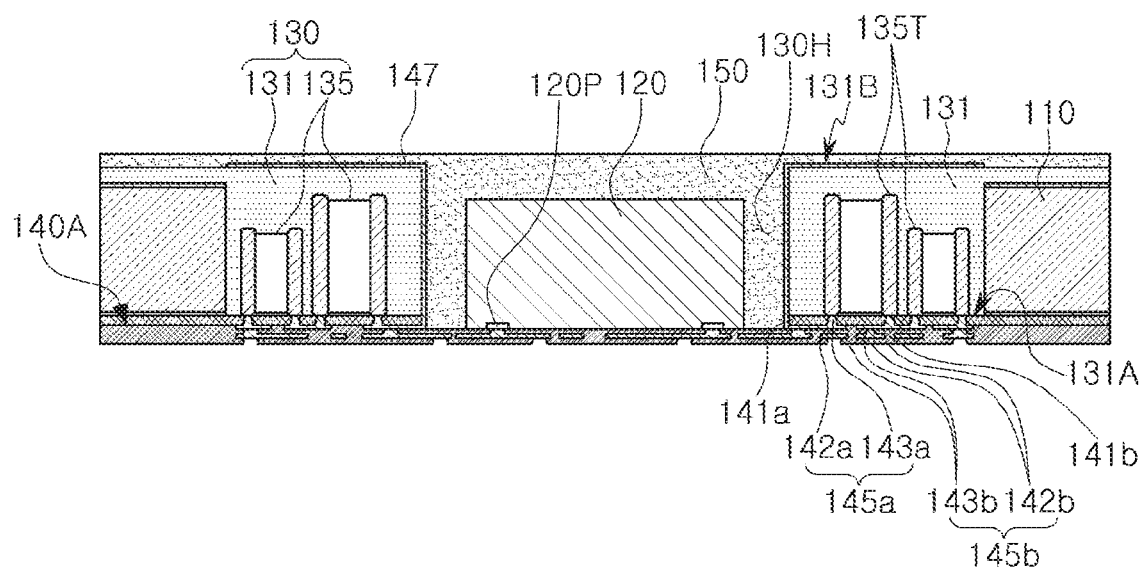
Figure 17D:
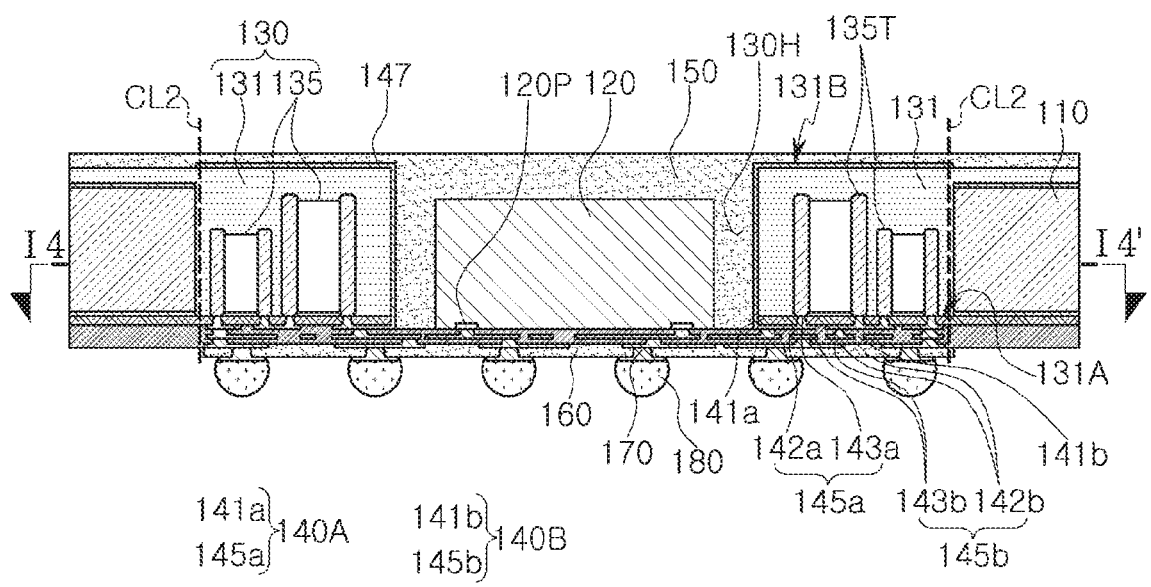
Figure 17E:
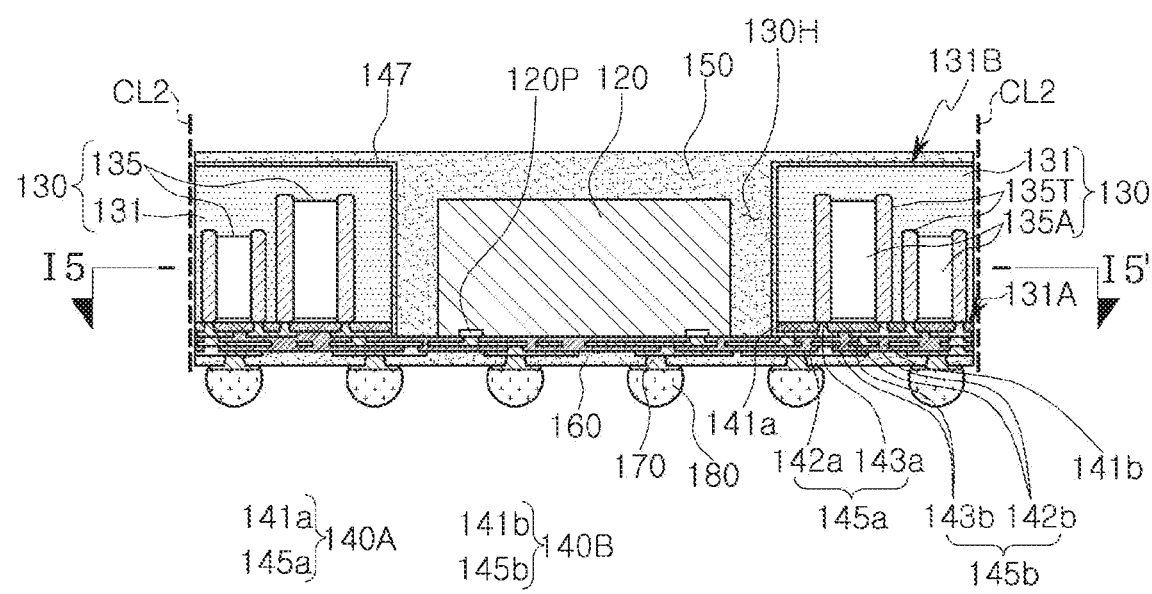
Figure 18:
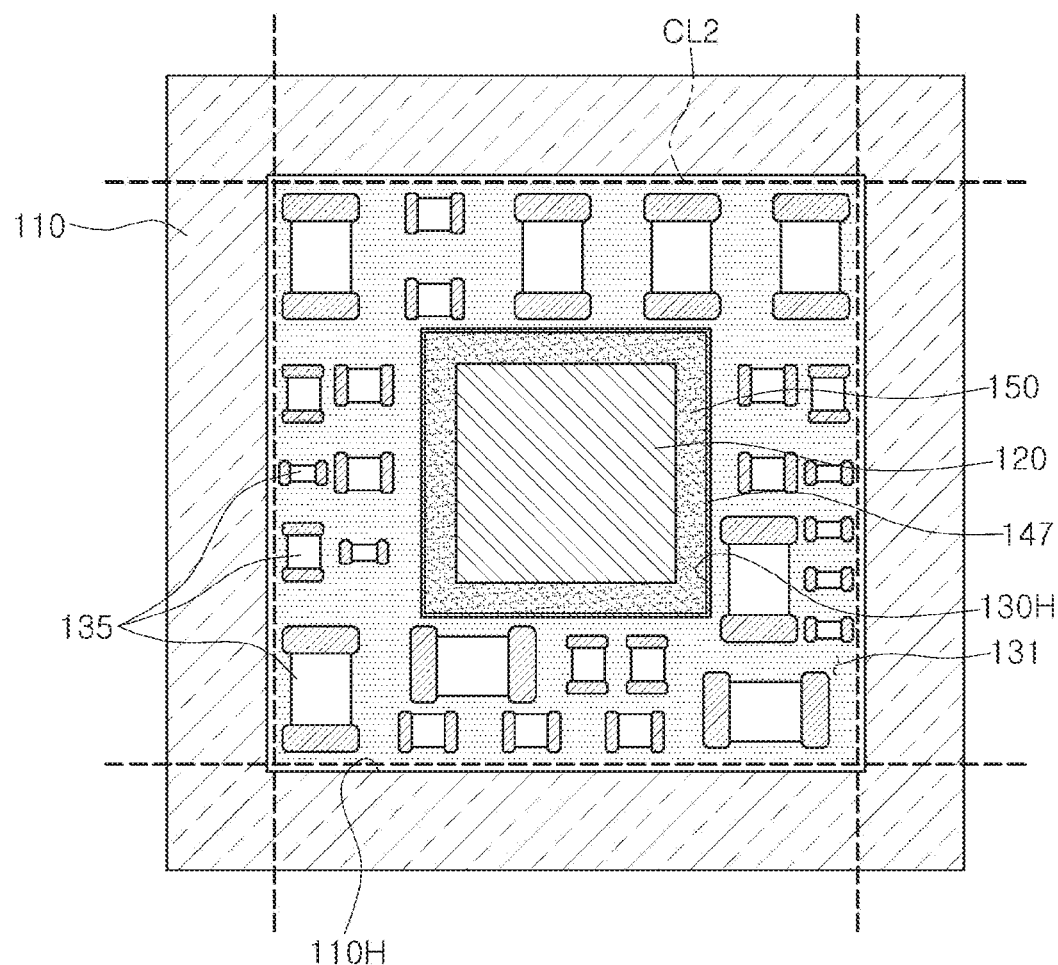
FIGS. 18 and 19 are plan views of results of FIGS. 17D and 17E, respectively.
Figure 19:
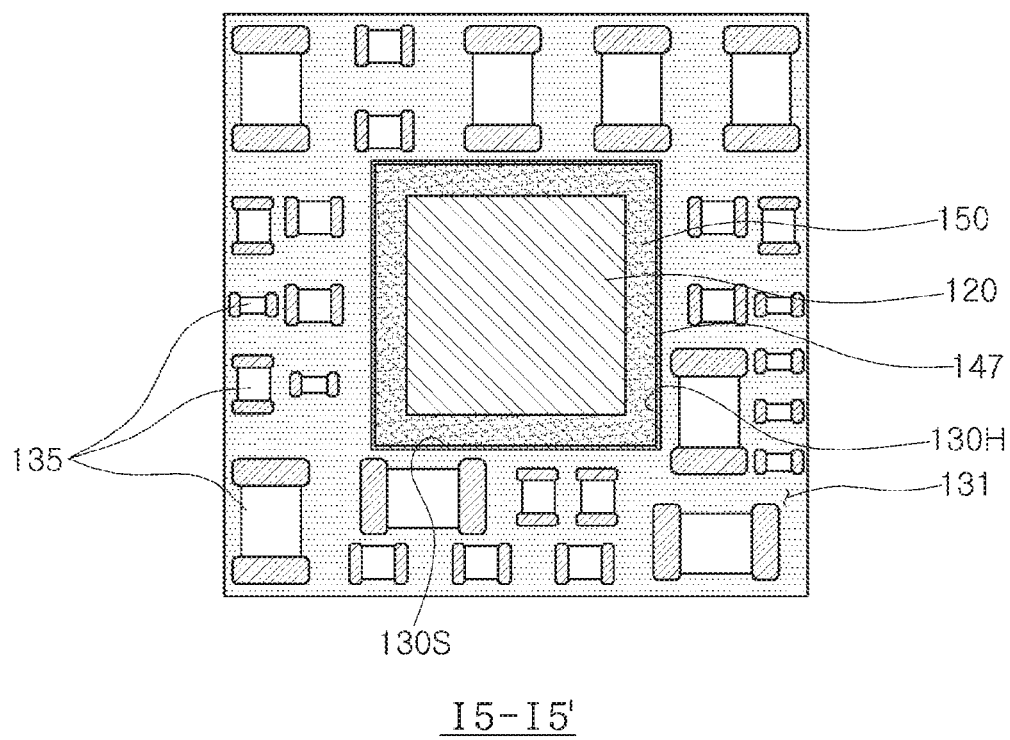

FIGS. 17A to 17E are cross-sectional views of main operations illustrating a process of forming a connection member during a method for manufacturing a semiconductor package according to an example embodiment of the present disclosure, while FIGS. 18 and 19 are plan views along line I4-I4' of FIG. 17D and line I5-I5' of FIG. 17E, respectively. A connection member provided in the operation described above corresponds to a first connection member.

Referring to FIG. 17A, the result, illustrated in FIG. 13E, is attached to a second carrier film 220.

In the attachment operation described above, a first connection member 140A, provided on the first surface 131A of the resin body 131, opposes the second carrier film 220 to be attached to the second carrier film 220. The second carrier film 220 may be a resin film having adhesiveness similar to that of the first carrier film 210. For example, the second carrier film 220 may be an adhesive tape containing an epoxy resin.

Then, referring to FIG. 17B, the semiconductor chip 120 is disposed in the cavity 130H, and an encapsulant 150 may be provided to encapsulate the semiconductor chip 120.

The semiconductor chip 120 is attached to the second carrier film 220, located in the cavity 130H, in the face-down form. An active surface of the semiconductor chip 120, that is, a surface having the connection pad 120P thereon may be attached to the second carrier film 220. Then, an encapsulant 150 may be provided to encapsulate the semiconductor chip 120, disposed in the cavity 130H. The encapsulant 150, provided in the operation described above, may cover the second surface 131B of the resin body 131 and the second surface 110B of the core member 110. The encapsulant 150 may be formed using a method of laminating a film in an uncured state and then curing the film, or a method of applying a liquid resin and then curing the liquid resin.

Then, referring to FIG. 17C, the second carrier film 220 is removed and a second connection member 140B may be provided.

Through the surface from which the second carrier film 220 is removed, the first connection member 140A and the active surface of the semiconductor chip 120 may be exposed. The second connection member 140B is formed on the exposed surface, thereby providing the second redistribution layer 145b redistributing the first redistribution layer 145a of the first connection member 140A and the connection pad 120P of the semiconductor chip 120. In the operation described above, a photo imagable dielectric (PID) material is applied to the exposed surface, thereby providing the second insulating layer 141b. Then, using a photolithography process, a via hole exposing the first redistribution layer 145a of the first connection member 140A and the connection pad 120P of the semiconductor chip 120 may be provided. Then, using electrolytic plating or electroless plating, a first redistribution layer 145a, including the first redistribution pattern 142a and the first redistribution via 143a, may be provided. In an example embodiment, the operation described above is additionally performed, thereby providing the second redistribution layer 145b having two levels. Here, the formation operation of the second connection member 140B described above may be performed while the second carrier film 220 is removed and an additional carrier film (not illustrated) is attached to a surface having the encapsulant 150 provided thereon.

Then, referring to FIG. 17D, a passivation layer 160 is formed on a lower surface of the second connection member 140B, and the UBM layer 170 connected to the second redistribution layer 145b and the electrical connection structure 180 may be provided on the passivation layer 160.

Using the lamination or applying method described above, the passivation layer 160 is provided on the second connection member 140B. An opening exposing a portion of the second redistribution layer 145b (in detail, the second redistribution pattern 142b) is formed in the passivation layer 160, the under-bump metal layer 170 is formed on the opening of the passivation layer 160 to be connected to an exposed region of the second redistribution layer 145b, and the electrical connection structure 180 may be provided on the under-bump metal layer 170.

Then, as illustrated in FIGS. 17D and 18, the core member 110, cut along the second cutting line CL2, is removed, so the semiconductor package illustrated in FIGS. 17E and 19 may be obtained.

The second cutting line CL2 may be located in a region of the resin body 131, adjacent to the core member 110. In the operation for forming the second shielding layer 149 (referring to FIG. 13E), plating may not be performed on a region in which the second cutting line CL2 is located, together with a surface of the cover member 110 (in other words, a seed layer is not provided). As a result, the cutting operation described above is performed along a portion including the resin body 131 and the first insulating layer 141a of the connection member 140A without a metal layer, and thus may be easily performed.

After the individualization operation described above, a second shielding layer 149 is additionally provided on a surface of the encapsulant 150, so the semiconductor package illustrated in FIGS. 9 and 10 may be manufactured. The formation operation of the second shielding layer 149 may be performed using a deposition process such as sputtering.

An example embodiment according to the present disclosure may be implemented in various forms. For example, a shielding structure including the second shielding layer 149 may be designed to be different, and an example embodiment may be implemented by introducing an additional heat dissipating device.

Hereinafter, various example embodiments will be described with reference to FIGS. 20 to 23.

Each of FIGS. 20 and 21 is a schematic cross-sectional view of a semiconductor package according to various example embodiments of the present disclosure.

Referring to FIG. 20, a semiconductor package 100A according to an example embodiment may be understood to be similar to the structure illustrated in FIGS. 9 and 10, except that a structure of a second shielding layer is different. The description of the components of the present disclosure may be referred to the description of the same or similar components of the semiconductor package 100 illustrated in FIGS. 9 and 10, unless specifically explained otherwise.

The semiconductor package 100A according to an example embodiment may include a second shielding layer 149' formed on an upper surface of an encapsulant 150, and a metal trench 148 passing through the encapsulant 150 to connect the first shielding layer 147 to the second shielding layer 149'. The metal trench 148 may have a shape surrounding the cavity 130H when the semiconductor package 100A is viewed on a plane for a sufficient shielding effect.

In an example embodiment, before an individualization operation (referring to FIG. 17E), the metal trench 148 and the second shielding layer 149' may be formed on an upper surface of the encapsulant at a panel level, and the individualization operation may be performed after the second shielding layer 149' is provided. As a result, a side surface of the semiconductor package 100A according to an example embodiment may be provided by a side surface 131S of the resin body 131. Meanwhile, another additional protective layer (not illustrated) may be formed on the side surface 131S of the resin body 131 after the individualization process, if necessary.

Referring to FIG. 21, a semiconductor package 100B according to an example embodiment may be understood to be similar to the structure illustrated in FIGS. 9 and 10, except that a heat sink 195 is included and a structure of a UBM via structure is different. The description of the components of the present disclosure may be referred to the description of the same or similar components of the semiconductor package 100 illustrated in FIGS. 9 and 10, unless specifically explained otherwise.

The semiconductor package 100B according to an example embodiment may further include a heat sink 195 disposed on an upper surface of the semiconductor chip 120. In an example embodiment, the heat sink 195 may be connected to the second shielding layer 149 by a metal via 198 passing through the encapsulant 150. Through the connection described above, a heat dissipation performance of the heat sink 195 may be improved. Moreover, the heat sink 195 and the metal via 198 may be used as a ground for the second shielding layer 149.

For example, the heat sink 195 and the metal via 198 may include a conductive material such as copper (Cu), aluminum (Al), silver (Ag), tin (Sn), gold (Au), nickel (Ni), lead (Pb), titanium (Ti), or alloys thereof. Moreover, an individual UBM layer 170', employed in an example embodiment, may include a plurality of UBM vias (for example, two UBM vias).

FIG. 22 is a schematic cross-sectional view of a semiconductor package according to an example embodiment of the present disclosure, and FIG. 23 is a plan view of the semiconductor package of FIG. 22 taken along line II-II'.

Referring to FIGS. 22 and 23, a semiconductor package 100C according to an example embodiment may be understood to be similar to the structure illustrated in FIGS. 9 and 10, except that a plurality of cavities are included. The description of the components of the present disclosure may be referred to the description of the same or similar components of the semiconductor package 100 illustrated in FIGS. 9 and 10, unless specifically explained otherwise.

The semiconductor package 100C according to an example embodiment may include a resin body 131' having a first cavity 130HA and a second cavity 130HB. The first cavity 130HA and the second cavity 130HB may include a first semiconductor chip 120A and a second semiconductor chip 120B, respectively. The first shielding layer 147 may be disposed on a second surface 131B of the resin body 131' and inner side walls of the first cavity 130HA and the second cavity 130HB, in a manner similar to the previously example embodiment. Moreover, the first shielding layer 147 may be connected to the first redistribution layer 145a at a lower end of the inner side wall of the first cavity 130HA and the second cavity 130HB.

In an example embodiment, a shape in which two cavities 130HA and 130HB are included in a single resin body 131' is illustrated by way of example, but three or more cavities may be included therein if necessary. Moreover, a shape in which an additional semiconductor chip is disposed in an additional cavity is illustrated by way of example, but other passive components (for example, a passive component having a relatively large size) may be disposed.

As set forth above, according to an exemplary embodiment, a core member according to the related art may be replaced with a structure in which a passive component is embedded, thereby providing a semiconductor package having a novel structure capable of optimizing a space in which a semiconductor chip and a passive component are embedded while easily implementing an EMI shielding structure.

Moreover, while an electrical connection path between a semiconductor chip and a passive component is shortened, a process defect such as undulation, cracking, or the like, may be reduced.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a support member including a resin body having a first surface and a second surface opposing each other and having a cavity passing through the first surface and the second surface, and at least one passive component embedded in the resin body and having a connection terminal exposed from the first surface;
   a first connection member having a first insulating layer disposed on the first surface of the resin body, and a first redistribution layer disposed on the first insulating layer and connected to the connection terminal;
   a second connection member having a second insulating layer disposed on the first connection member and covering a surface of the cavity, and a second redistribution layer disposed on the second insulating layer and connected to the first redistribution layer;
   a semiconductor chip disposed on the second connection member in the cavity and having a connection pad connected to the second redistribution layer; and
   an encapsulant covering the second surface of the resin body while encapsulating the semiconductor chip located in the cavity,
   wherein a plane extending from the first surface of the resin body intersects a side surface of the semiconductor chip, and
   wherein a thickness of the first connection member corresponds to a first distance from the plane to a surface of the semiconductor chip on which the connection pad is disposed.

2. The semiconductor package of claim 1, further comprising a first shielding layer disposed on the second surface of the resin body and an inner side wall of the cavity, and connected to the first redistribution layer,
   wherein the first shielding layer extends along an entire width of the second surface of the resin body.

3. The semiconductor package of claim 2, further comprising a second shielding layer disposed on an upper surface of the encapsulant, and connected to the first shielding layer.

4. The semiconductor package of claim 3, wherein the second shielding layer extends along a side surface of the resin body, and is connected to the first shielding layer on the side surface of the resin body.

5. The semiconductor package of claim 3, wherein the second shielding layer is connected to the first shielding layer by a metal trench passing through the encapsulant.

6. The semiconductor package of claim 3, further comprising a heat sink disposed on an upper surface of the semiconductor chip,
   wherein the heat sink is connected to the second shielding layer by a metal via passing through the encapsulant.

7. The semiconductor package of claim 1, wherein a lower surface of the first connection member is substantially coplanar with the surface on which the connection pad of the semiconductor chip is disposed.

8. The semiconductor package of claim 1, wherein the first insulating layer and the second insulating layer include different insulating materials.

9. The semiconductor package of claim 8, wherein the first insulating layer includes a non-photo imagable dielectric material, and the second insulating layer includes a photo imagable dielectric material.

10. The semiconductor package of claim 1, wherein the second connection member comprises a third redistribution layer disposed on a level different from a level of the second redistribution layer in the second insulating layer and connected to the second redistribution layer.

11. The semiconductor package of claim 10, wherein the second connection member further comprises a trench stack disposed along an edge of the second connection member.

12. The semiconductor package of claim 11, further comprising a first shielding layer disposed on the second surface of the resin body and an inner side wall of the cavity, and connected to the first redistribution layer, and
   a second shielding layer disposed on an upper surface of the encapsulant, and extending along a side surface of the resin body and connected to the first shielding layer and the trench stack.

13. The semiconductor package of claim 1, further comprising a passivation layer disposed on a lower surface of the second connection member, and having a plurality of openings exposing a portion of the second redistribution layer, and
   an electrical connection structure disposed in the plurality of openings of the passivation layer, and connected to the exposed portion of the second redistribution layer.

14. A semiconductor package comprising:
   a support member including a resin body having a first surface and a second surface opposing each other and having at least one cavity passing through the first surface and the second surface, and a plurality of passive components embedded in the resin body and having a connection terminal exposed from the first surface;
   a first connection member having a first insulating layer disposed on the first surface of the resin body, and a first redistribution layer disposed on the first insulating layer and connected to the connection terminal;

a second connection member having a second insulating layer disposed on a lower surface of the first connection member and covering a surface of the at least one cavity, and second redistribution layers disposed on different levels in the second insulating layer, the second redistribution layers being connected to the first redistribution layer or another adjacent second redistribution layer;

a first semiconductor chip disposed on the second connection member in the at least one cavity and having a connection pad connected to the second redistribution layers;

a first shielding layer disposed on the second surface of the resin body and an inner side wall of the at least one cavity, and connected to the first redistribution layer;

an encapsulant covering the second surface of the resin body while encapsulating the first semiconductor chip located in the at least one cavity; and a second shielding layer disposed on an upper surface of the encapsulant, and connected to the first shielding layer, wherein a plane extending from the first surface of the resin body intersects a side surface of the first semiconductor chip, and wherein a thickness of the first connection member corresponds to a first distance from the plane to a surface of the first semiconductor chip on which the connection pad is disposed.

15. The semiconductor package of claim 14, wherein the at least one cavity includes a plurality of cavities, in which the first semiconductor chip and second semiconductor chips disposed, respectively, and the first shielding layer extends along an inner side wall of each of the plurality of cavities.

16. A semiconductor package comprising:
a resin body having a first surface and a second surface opposing each other, and a passive component partially embedded in the resin body and having a connection terminal exposed from the resin body;

a first connection member including a first insulating layer disposed on the resin body, and a first redistribution layer disposed on the first insulating layer and including a first redistribution via penetrating the first insulating layer and connected to the connection terminal of the passive component;

a semiconductor chip disposed in a cavity of the resin body and having a connection pad;

a second connection member having a second insulating layer disposed on the first connection member and the semiconductor chip, and a second redistribution layer disposed on the second insulating layer and connected to the first redistribution layer and the connection pad of the semiconductor chip; and an encapsulant covering the resin body and the semiconductor chip, and including a portion disposed between the semiconductor chip and the first insulating layer of the first connection member, wherein a plane extending from the first surface of the resin body intersects a side surface of the semiconductor chip, and wherein a thickness of the first connection member corresponds to a first distance from the plane to a surface of the semiconductor chip on which the connection pad is disposed.

17. The semiconductor package of claim 16, further comprising a first shielding layer disposed on the resin body and an inner side wall of the cavity, connected to the first redistribution layer, and separating the portion of the encapsulant from the first insulating layer, wherein the first shielding layer extends along an entire width of the second surface of the resin body.

18. The semiconductor package of claim 17, further comprising a second shielding layer disposed on the encapsulant and connected to the first shielding layer.

19. The semiconductor package of claim 18, wherein the second shielding layer extends along a side surface of the resin body, and is connected to the first shielding layer on the side surface of the resin body.

20. The semiconductor package of claim 19, wherein the second connection member further comprises a trench stack disposed along an edge of the second connection member, and the second shielding layer further extends to cover a side surface of the second connection member and to connect to the trench stack on the side surface of the second connection member.

21. The semiconductor package of claim 18, wherein the second shielding layer is connected to the first shielding layer by a metal trench passing through the encapsulant.

22. The semiconductor package of claim 18, further comprising a heat sink disposed on the semiconductor chip, wherein the heat sink is connected to the second shielding layer by a metal via passing through the encapsulant.

23. The semiconductor package of claim 16, wherein lower surfaces of the first connection member and the connection pad of the semiconductor chip are substantially coplanar with each other.

24. A semiconductor package comprising:
a resin body having a first surface and a second surface opposing each other, and a passive component partially embedded in the resin body and having a connection terminal exposed from the resin body;

a semiconductor chip disposed in a cavity of the resin body and having a connection pad;

a connection member having an insulating layer disposed on the resin body and the semiconductor chip, and a redistribution layer disposed on the insulating layer and connected to the connection terminal of the passive component and the connection pad of the semiconductor chip;

an encapsulant covering the resin body and the semiconductor chip, and including a portion disposed between the semiconductor chip and the resin body; and a first shielding layer including a first portion disposed on an upper surface of the resin body and a second portion extending from the first portion and covering an inner side wall of the cavity, wherein the second portion covering the inner side wall of the cavity is in physical contact with a portion of the resin body between the passive component and the semiconductor chip, and wherein a plane extending from the first surface of the resin body intersects a side surface of the semiconductor chip, and wherein a thickness of the connection member corresponds to a first distance from the plane to a surface of the semiconductor chip on which the connection pad is disposed.

25. The semiconductor package of claim 24, further comprising a second shielding layer disposed on the encapsulant and connected to the first shielding layer.

26. The semiconductor package of claim 25, wherein the second shielding layer includes a portion extends along a side surface of the resin body, and the portion of the second shielding layer is in physical contact with a portion of the resin body between the passive component and the portion of the second shielding layer.

27. The semiconductor package of claim 24, wherein the first shielding layer extends along an entire width of the second surface of the resin body.

\* \* \* \* \*